(12) United States Patent
Bal et al.

(10) Patent No.: US 6,556,648 B1
(45) Date of Patent: Apr. 29, 2003

(54) LITHOGRAPHIC APPARATUS, DEVICE MANUFACTURING METHOD, AND DEVICE MANUFACTURED THEREBY

(75) Inventors: Matthieu Frederic Bal, Delft (NL); Florian Bociort, Delft (NL); Josephus Johannes Maria Braat, Delft (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 09/985,645

(22) Filed: Nov. 5, 2001

(30) Foreign Application Priority Data

Nov. 7, 2000 (EP) .............................. 00309871

(51) Int. Cl.$^7$ ................................................ G21K 5/00
(52) U.S. Cl. ........................... 378/34; 378/85; 359/853; 359/859; 250/492.2
(58) Field of Search .............................. 378/34, 35, 85, 378/145; 359/850, 853, 857, 858, 859; 250/492.2

(56) References Cited

U.S. PATENT DOCUMENTS

| | | | |
|---|---|---|---|
| 5,153,898 A | 10/1992 | Suzuki et al. ................. 378/34 |
| 5,686,728 A | 11/1997 | Shafer ..................... 250/492.2 |
| 5,815,310 A | 9/1998 | Williamson ................ 359/858 |
| 5,956,192 A | 9/1999 | Williamson ................ 359/859 |
| 5,973,826 A | 10/1999 | Chapman et al. .......... 359/335 |
| 6,072,852 A | 6/2000 | Hudyma et al. .............. 378/34 |
| 6,081,578 A | 6/2000 | Braat ......................... 378/34 |
| 6,188,513 B1 * | 2/2001 | Hudyma et al. ............ 359/859 |
| 6,199,991 B1 | 3/2001 | Braat ......................... 359/859 |
| 6,226,346 B1 | 5/2001 | Hudyma ...................... 378/34 |
| 6,255,661 B1 | 7/2001 | Braat ......................... 378/34 |
| 6,262,836 B1 | 7/2001 | Hudyma et al. ............ 359/859 |
| 6,353,470 B1 * | 3/2002 | Dinger et al. .............. 359/859 |
| 6,361,176 B1 * | 3/2002 | Mashima .................... 359/859 |
| 6,400,794 B1 * | 6/2002 | Schultz et al. ................ 378/34 |
| 6,438,199 B1 * | 8/2002 | Schultz et al. ................ 378/34 |

FOREIGN PATENT DOCUMENTS

| WO | 99/57596 | 11/1999 |
|---|---|---|
| WO | 99/57606 | 11/1999 |

OTHER PUBLICATIONS

Lerner etal, "Design Approach and Comparison of Projection Cameras for EUV Lithography", Opt. Eng. 39(3) pp 792–802 (Mar. 2000).

* cited by examiner

Primary Examiner—Drew A. Dunn
(74) Attorney, Agent, or Firm—Pillsbury Winthrop LLP

(57) ABSTRACT

A classification system for systems of n mirrors, whereby systems of mirrors are classified by a number C, is defined as follows:

$$C = \sum_{i=1}^{n} a_i \cdot 2^{(n-i)} \left( \frac{M}{|M|} \right)$$

where: $a_i=1$ if the angle of incidence of the chief ray at mirror i is negative, $a_i=0$ if the angle of incidence of the chief ray at mirror i is positive, M is the magnification of the projection system, and index i numbers the mirrors of the system in series. Four mirror systems, six mirror systems and eight mirror systems in accordance with the present invention are useful in EUV lithography projection systems.

38 Claims, 10 Drawing Sheets

LITHOGRAPHIC APPARATUS, DEVICE MANUFACTURING METHOD, AND DEVICE MANUFACTURED THEREBY

BACKGROUND OF THE INVENTION

1. Field of the Invention

The present invention relates generally to lithographic projection apparatus and more particularly to lithographic projection apparatus including imaging mirrors.

2. Description of the Related Art

Lithographic projection apparatus generally include a radiation system for supplying a projection beam of radiation, a support structure for supporting patterning structure, the patterning structure serving to pattern the projection beam according to a desired pattern, a substrate table for holding a substrate and a projection system for projecting the patterned beam onto a target portion of the substrate.

This application claims priority from EP 00309871.2 filed Nov. 7, 2000 which is incorporated by reference herein in its entirety.

The term "patterning structure" as here employed should be broadly interpreted as referring to means that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such patterning structure include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from U.S. Pat. No. 5,296,891 and U.S. Pat. No. 5,523,193, which are incorporated herein by reference. In the case of a programmable mirror array, the said support structure may be embodied as a frame or table, for example, which may be fixed or movable as required.

A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning structure as hereabove set forth.

Lithographic projection apparatus can be used, for example, in the manufacture of integrated circuits (IC.s). In such a case, the patterning structure may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441 and WO 98/40791, incorporated herein by reference.

No material suitable for manufacturing refractive lenses usable with EUV radiation is known. Accordingly, a projection system for a lithographic apparatus making use of EUV radiation for the projection beam must be based on reflective optics, generally with multi-layer coated mirrors. Projection systems for EUV radiation have been proposed, for example in: "Design approach and comparison of projection cameras for EUV lithography", Lerner et al Opt. Eng. 39(3) 792–802) March 2000; WO99/57596 (Braat); WO99/57606 (Braat), U.S. Pat. No. 5,686,728 (Shafer) and U.S. Pat. No. 5,815,310 (Williamson). These systems have various shortcomings, such as being far from telecentric or having very little working space, and a need exists for alternative systems. In a classification system described below, the Braat six-mirror systems fall into class 41 (+) and the Williamson six-mirror design falls into class 45(−). The four-mirror systems described by Lerner et al fall into classes 9(+) and 10(−). The six- and eight-mirror systems described by Shafer fall into classes 41(+) and 165(+).

SUMMARY OF THE INVENTION

One aspect of the present invention provides alternative and improved projection systems for EUV radiation and a methodology for designing such systems.

According to a first aspect of the present invention there is provided a lithographic projection apparatus comprising:

a radiation system for providing a projection beam of radiation;

a support structure for supporting patterning structure, the patterning structure serving to pattern the projection beam according to a desired pattern;

a substrate table for holding a substrate;

a projection system for projecting the patterned beam onto a target portion of the substrate, characterized in that:

said projection system has precisely four imaging mirrors in the optical path of the projection beam and has an incidence angle classification, C, of 2(−), 6(−), or 9(−), where:

$$C = \sum_{i=1}^{4} a_i \cdot 2^{(4-i)} \left( \frac{M}{|M|} \right)$$

$a_i=1$ if the angle of incidence of the chief ray at mirror i is negative,
$a_i=0$ if the angle of incidence of the chief ray at mirror i is positive,
M is the magnification of the projection system, and the index i numbers the mirrors from object to image.

According to a second aspect of the present invention there is provided a lithographic projection apparatus comprising:

a radiation system for providing a projection beam of radiation;

a support structure for supporting patterning structure, the patterning structure serving to pattern the projection beam according to a desired pattern;

a substrate table for holding a substrate;

a projection system for projecting the patterned beam onto a target portion of the substrate, characterized in that:

said projection system has precisely six imaging mirrors in the optical path of the projection beam and has an incidence angle classification, C, of 5(+), 6(−), 9(+), 13(+), 18(−), 21 (+), 22(−), 25(+), 29(+), 34(−), 37(+), 38(−), 42(−), or 54(−), where:

$$C = \sum_{i=1}^{6} a_i \cdot 2^{(6-i)} \left( \frac{M}{|M|} \right)$$

$a_i=1$ if the angle of incidence of the chief ray at mirror i is negative,
$a_i=0$ if the angle of incidence of the chief ray at mirror i is positive,
M is the magnification of the projection system, and the index i numbers the mirrors from object to image.

According to a third aspect of the present invention there is provided a lithographic projection apparatus comprising:

a radiation system for providing a projection beam of radiation;

a support structure for supporting patterning structure, the patterning structure serving to pattern the projection beam according to a desired pattern;

a substrate table for holding a substrate;

a projection system for projecting the patterned beam onto a target portion of the substrate, characterized in that:

said projection system has precisely eight imaging mirrors in the optical path of the projection beam and has an incidence angle classification, C, of 2(+), 5(+), 9(+), 12(+), 13(+), 18(+), 18(−), 19(+), 20(+), 21(+), 22(+), 23(+), 25(+), 26(+), 26(+), 34(−), 36(+), 37(+), 38(−), 45(+), 46(+), 49(+), 52(+), 53(+), 54(+), 54(−), 55(−), 58(−), 68(+), 69(+), 73(+), 74(+), 77(+), 82(+), 82(−), 85(+), 88(+), 89(+), 90(−), 92(+), 93(+), 97(+), 100(−), 101(+), 102(−), 104(+), 105(+), 106(+), 106(−), 107(+), 108 (+), 109(+), 109(−), 110(+), 110(−), 111(+), 113(+), 116(+), 117(+), 118(+), 118(−), 120(+), 121(+), 122 (−), 123(−), 132(+), 133(+), 134(−), 137(+), 138(+), 141(+), 145(+), 145(−), 146(+), 146(−), 147(+), 148 (+), 148(−), 149(+), 150(+), 152(−), 153(+), 154(+), 154(−), 155(+), 155(−), 156(+), 157(+), 159(+), 161 (+), 162(−), 163(−), 164(+), 165(+), 166(+), 166(−), 167(+), 168(+), 169(+), 170(+), 170(−), 171(+), 172 (+), 173(+), 174(+), 175(+), 176(+), 177(+), 178(−), 179(+), 180(+), 180(−), 181(+), 182(+), 182(−), 183 (+), 183(−), 184(+), 185(+), 185(−), 186(−), 187(+), 187(−), 188(−), 189(+), 196(+), 197(+), 201(+), 203 (+), 205(+), 209(+), 214(−), 216(+), 217(+), 218(+), 218(+), 218(−), 225(+), 228(+), 229(+), 30(+), 232 (+), 233(+), 235(+), 236(+), 237(+), 238(−), 243(+), 246(+), 247(+), 248(+), 250(−), where:

$$C = \sum_{i=1}^{8} a_i \cdot 2^{(8-i)} \left( \frac{M}{|M|} \right)$$

$a_i = 1$ if the angle of incidence of the chief ray at mirror i is negative,
$a_i = 0$ if the angle of incidence of the chief ray at mirror i is positive,
M is the magnification of the projection system, and the index i numbers the mirrors from object to image.

An embodiment of the present invention may comprise a four-mirror projection system in class 6(−) with a numerical aperture of 0.15, a ring field between −22.8 mm and −23.8 mm on the image side, and a transverse magnification of −0.2 at a wavelength of 13 nm. Such a system can have a minimum Strehl ratio of 0.972, a maximal wavefront error of 0.0266 waves and a maximal distortion of 12 nm.

The present invention, in a fourth aspect also provides a device manufacturing method using a lithography apparatus comprising:

an illumination system constructed and arranged to supply a projection beam of radiation;
a first object table constructed to hold a mask;
a second object table constructed to hold a substrate; and
a projection system constructed and arranged to image an irradiated portion of the mask onto target areas of the substrate; the method comprising the steps of:
providing a mask containing a pattern to said first object table;
providing a substrate which is at least partially covered by a layer of radiation-sensitive material to said second object table;
irradiating portions of the mask and imaging said irradiated portions of said mask onto said target areas of said substrate; characterized in that:
in the step of imaging, a projection system as defined in any one of the first, second and third aspects described above is used.

In a manufacturing process using a lithographic projection apparatus according to the invention a pattern in a mask is imaged onto a substrate which is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skill ed artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm), as well as particle beams, such as ion beams or electron beams.

BRIEF DESCRIPTION OF THE DRAWINGS

The present invention and its attendant advantages will be described below with reference to exemplary embodiments and the accompanying schematic drawings, in which.

In the various drawings, like parts are indicated by like references.

DETAILED DESCRIPTION OF EMBODIMENTS OF THE INVENTION

Embodiment 1

Figure 1:
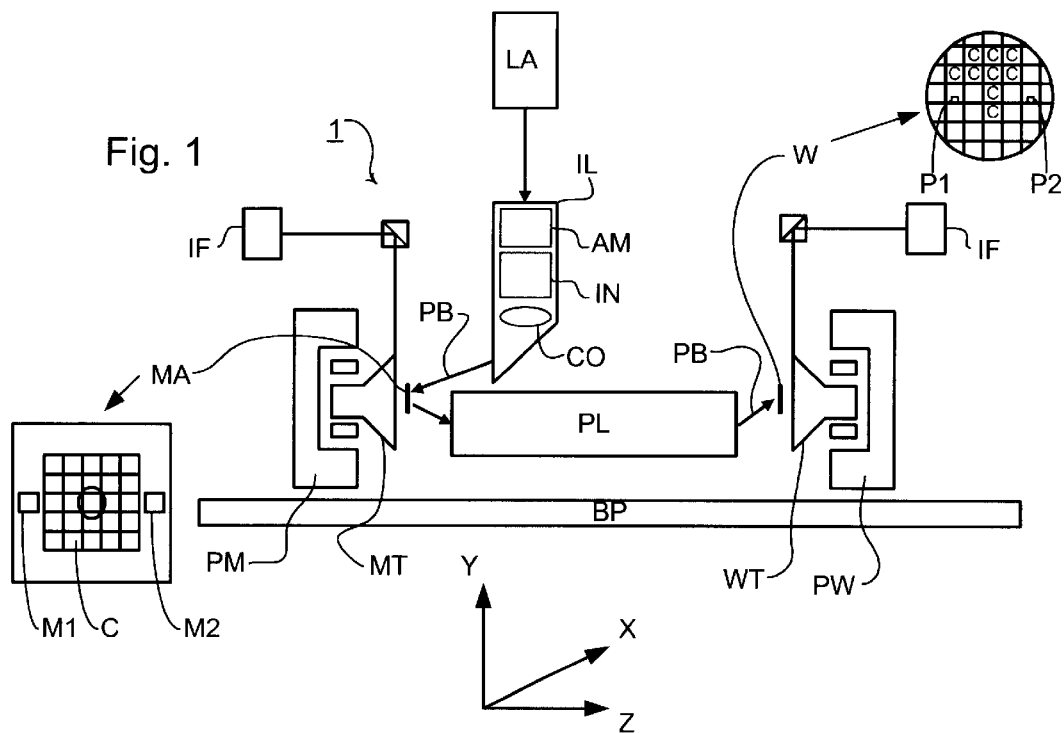
FIG. 1 depicts a lithographic projection apparatus according to a first embodiment of the invention.

FIG. 1 schematically depicts a lithographic projection apparatus according to a particular embodiment of the invention. The apparatus comprises:

a radiation system Ex, IL, for supplying a projection beam PB of radiation (e.g. EUV radiation), which in this particular case also comprises a radiation source LA;
a first object table (mask table) MT provided with a mask holder for holding a mask MA (e.g. a reticle), and connected to first positioning means PM for accurately positioning the mask with respect to item PL;
a second object table (substrate table) WT provided with a substrate holder for holding a substrate W (e.g. a resist-coated silicon wafer), and connected to second positioning means PW for accurately positioning the substrate with respect to item PL;
a projection system ("lens") PL (e.g. a mirror group) for imaging an irradiated portion of the mask MA onto a target portion C (e.g. comprising one or more dies) of the substrate W. As here depicted, the apparatus is of a reflective type (i.e. has a reflective mask). However, in general, it may also be of a transmissive type, for example (with a transmissive mask). Alternatively, the apparatus may employ another kind of patterning structure, such as a programmable mirror array of a type as referred to above.

The source LA (e.g. a discharge or laser-produced plasma source) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and Claims encompass both of these scenarios.

The beam PB subsequently intercepts the mask MA, which is held on a mask table MT. Having been selectively reflected by the mask MA, the beam PB passes through the lens PL, which focuses the beam PB onto a target portion C of the substrate W. With the aid of the second positioning means PW (and interferometric measuring means IF), the substrate table WT can be moved accurately, e.g. so as to position different target portions C in the path of the beam PB. Similarly, the first positioning means PM can be used to accurately position the mask MA with respect to the path of the beam PB, e.g. after mechanical retrieval of the mask MA from a mask library, or during a scan. In general, movement of the object tables MT, will be realized with the aid of a long-stroke module (course positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different modes:
1. In step mode, the mask table MT is kept essentially stationary, and an entire mask image is projected at once (i.e. a single "flash") onto a target portion C. The substrate table WT is then shifted in the x and/or y directions so that a different target portion C can be irradiated by the beam PB;
2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Mirror System Classification

Figure 2:
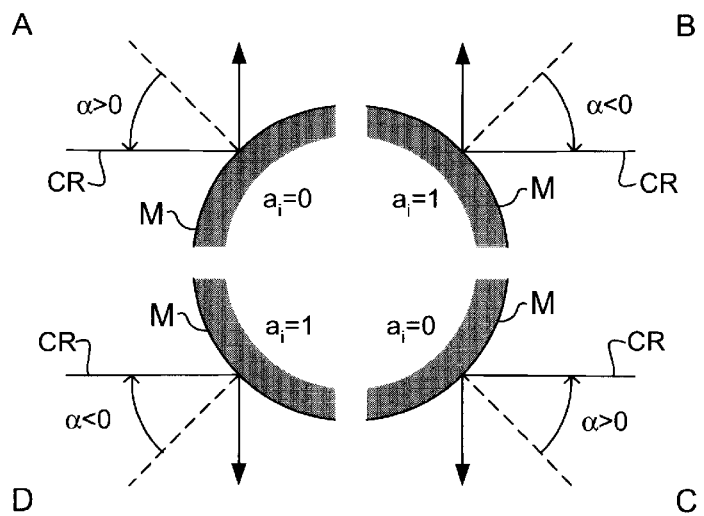
FIG. 2 is a diagram used in explaining the incidence angle classification system of the present invention.

According to the present invention, a mirror system of n mirrors is classified by reference to the direction of the reflected beam compared to the incident beam at each mirror surface. Having defined the object height to be positive along a Y-axis and a suitable reference plane, e.g. the plane containing the optical axis Z of the projection system and the Y-axis (as shown in FIG. 1), the chief ray CR at a mirror is defined as having a positive angle of incidence α, if the angle between the normal of the surface and the incident ray is counterclockwise (as shown in FIG. 2) and a negative angle of incidence if the angle between the normal and the incident ray is clockwise. Further, one should view this reference plane along a positive X direction, the X, Y, Z directions making up a right-handed orthogonal coordinate system, as shown in FIG. 1. The chief ray is defined as that ray emerging from the object point, which goes through the center of the stop and therefore also through the center of the entrance and exit pupils, i.e. at a height equal to zero from the optical axis. (NB this assignment is arbitrary, the scheme can be implemented with either relative direction of reflection regarded as positive, provided that the assignment is consistent.) By assigning the binary digit "1" to a negative angle of incidence and "0" to a positive angle of incidence of the chief ray, a mirror system is assigned a binary number defined by the sequence of binary digits assigned to each mirror in the system in sequence along the optical path of the beam from object to source. For convenience, this binary number is expressed in decimal notation.

The various classes of the incidence angle classification system are further characterized by indicating the sign of the magnification of the system. Herein, this is indicated by the appropriate sign in parentheses after the class number, e.g. 6(−). The sign is obtained by dividing the magnification M by its absolute value |M|. A system has a positive magnification if the object and image are the same side of the optical axis and a negative magnification if they are opposite sides.

The decimal incidence angle classification, C, can thus be expressed as:

$$C = \sum_{i=1}^{n} a_i \cdot 2^{(n-i)} \left( \frac{M}{|M|} \right) \quad (1)$$

where: $a_i=1$ if the angle of incidence of the chief ray at mirror i is negative,
$a_i=0$ if the angle of incidence of the chief ray at mirror i is positive,
M is the magnification of the projection system, and
index i numbers the mirrors of the system in series from object to source.

FIG. 2 shows the four possible arrangements of incident chief rays CR and mirrors M. In A the incident chief ray is travelling left to right and has an angle of incidence α>0, so $a_i=0$. In B the incident chief ray is travelling right to left and has an angle of incidence α<0, so $a_i=1$. In C the incident chief ray is travelling right to left and has an angle of incidence α>0, so $a_i=0$. In D the incident chief ray is travelling left to right with an angle of incidence α<0, so $a_i=1$. Note that although convex mirrors are shown, the same assignments apply with concave or plane mirrors.

While the incidence angle classification C does not wholly define a mirror system, the basic layout of a system is inherent in its incidence angle classification. By reference to whether the reflection at a given mirror is positive or negative, the orientation of that mirror and the position of the succeeding mirror, above or below the beam, can be determined. Thus a given classification number can be used by the designer of a mirror system to set out the system prior to optimization of that system, e.g. using commercially available ray tracing software such as CODE V(TM) by Optical Research Associates, Pasadena, Calif., USA. It should be noted that previous classifications of mirror systems based on whether the curvature, and hence power, of each mirror in the system is positive or negative, do not give any information as to the layout of a mirror system. It will also be noted that the incidence angle classification of a given mirror system can readily be determined from simple inspection of the beam path.

Using the above classification system and numerical simulations, the present inventors have determined that only certain classes contain mirror systems usable as the projection system in a lithographic projection system. For four-mirror systems, feasible projection systems exist in classes 2(−), 6(−), 9(+), 9(−) and 10(−). For six-mirror systems, feasible projection systems exist in classes 5(+), 6(−), 9(+), 13(+), 18(−), 21(+), 22(−), 25(+), 26(−), 29(+), 34(−), 37(+), 38(−), 41(+), 42(−), 45(+) and 54(−). For eight-mirror systems, feasible projection systems exist in class 2(+), 5(+), 9(+), 12(+), 13(+), 18(+), 18(−), 19(+), 20(+), 21(+), 22(+), 23(+), 25(+), 26(+), 34(−), 36(+), 37(+), 38(−), 45(+), 46(+), 49(+), 52(+), 53(+), 54(+), 54(−), 55(−), 58(−), 68(+), 69(+), 73(+), 74(+), 77(+), 82(+), 82(−), 85(+), 88(+), 89(+), 90(−), 92(+), 93(+), 97(+), 100(−), 101(+), 102(−), 104(+), 105(+), 106(+), 106(−), 107(+), 108(+), 109(+), 109(−), 110(+), 110(−), 111(+), 113(+), 116(+), 117(+), 118(+), 118(−), 120(+), 121(+), 122(−), 123(−), 132(+), 133(+), 134(−), 137(+), 138(+), 141(+), 145(+), 145(−), 146(+), 146(−), 147(+), 148(+), 148(−), 149(+), 150(+), 150(−), 151(+), 151(−), 152(−), 153(+), 154(+), 154(−), 155(+), 155(−), 156(+), 157(+), 159(+), 161(+), 162(−), 163(−), 164(+), 165(+), 166(+), 166(−), 167(+), 168(+), 169(+), 170(+), 170(−), 171(+), 172(+), 173(+), 174(+), 175(+), 176(+), 177(+), 178(−), 179(+), 180(+), 180(−), 181(+), 181(−), 182(+), 182(−), 183(+), 183(−), 184(+), 185(+), 185(−), 186(−), 187(+), 187(−), 188(−), 189(+), 196(+), 197(+), 201(+), 203(+), 205(+), 209(+), 214(−), 216(+), 217(+), 218(+), 218(−), 225(+), 228(+), 229(+), 230(+), 232(+), 233(+), 235(+), 236(+), 237(+), 238(−), 243(+), 246(+), 247(+), 248(+), 250(−).

Design Methodology

As mentioned above, a given class defines an outline layout for a mirror system for which a functional projection system can be designed. A methodology according to the present invention for such a design process is described below.

Figure 3:
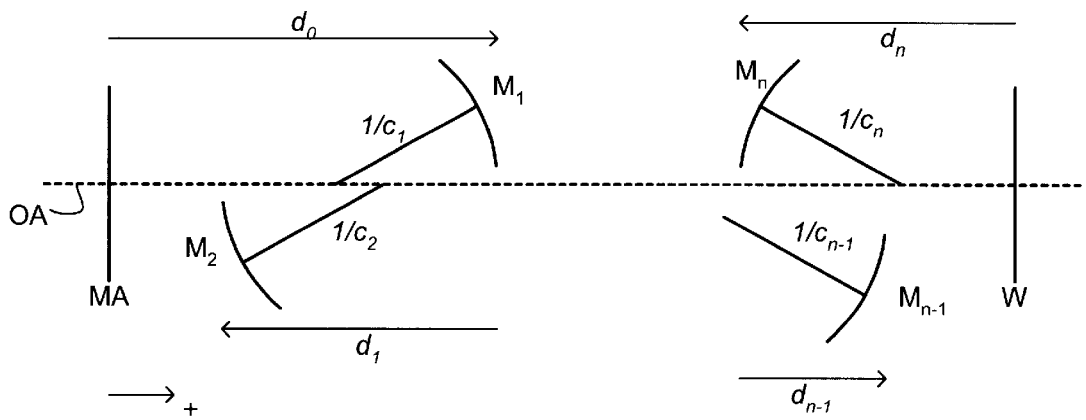
FIG. 3 is a diagram showing the thickness and curvature definitions used in the present invention.

In the design process according to the invention, the mirrors in a system are defined by "thicknesses" and curvatures, defined as shown in FIG. 3. (NB the term "thickness" is used by analogy to refractive systems which are conventionally defined in terms of surface curvatures, thicknesses between surfaces and the refractive indices of the media between surfaces.) Thus, thickness $d_1$ is the distance between the object, the mask MA in the present case of a projection system in a lithographic apparatus, and the intersection of the (imaging extended) first mirror $M_1$ with the optical axis OA. The distance between the intersections of the (imaging extended) first mirror $M_1$ and the (imaging extended) second mirror $M_2$ with the optical axis OA is $d_1$. Note that since the second mirror is situated between the first mirror $M_1$ and the object (mask MA), thickness $d_1$ is negative. In general, thickness $d_i$ is the distance between the intersections of mirror $M_i$ and mirror $M_{i+1}$ with the optical axis OA. For an n-mirror system, the thickness $d_n$ is the distance between the last mirror $M_n$ and the image plane, where the substrate W is positioned in a lithographic projection apparatus. In specific embodiments described below, an additional thickness $d_{n+1}$ is given, this represents the distance between the position of the image calculated using a first order approximation and using a real ray tracing algorithm.

In a first step the design method identifies conceivable systems under a number of constraints by using a paraxial approach described below. Those systems should not present obscuration, as is also described further below. The paraxial approach and the constraints yield a limited number of variables that are sampled to identify solutions. In a further step those solutions are checked using a real ray tracing method, referred to above, in which the paraxial assumptions are not present and in which also multilayer coatings of the reflectors may be modelled.

Paraxial Approach

The present inventors have developed an approach to designing mirror systems which starts with a paraxial approximation of a mirror system using matrix formalism. In a paraxial approximation the sine of an angle is approximated as the angle, i.e. $\sin \alpha = \alpha$, and are the mirrors considered as being flat, while the actual curvature of a mirror is considered only to affect the angle of an incident ray, not its point of intersection with the supposedly 'flat' surface.

In a matrix formalism, such as described in "Introduction to Optics" by Frank & Leno Pedrotti, Prentice Hall 1993; ISBN: 0135015456, incorporated herein by reference, the description of an optical system consist of an accumulation of translation and reflection (and/or refraction in a catadioptric or refractive system) matrices $M_{trans}, M_{refl}$ which are defined as follows:

$$M_{trans} = \begin{bmatrix} 1 & d_i \\ 0 & 1 \end{bmatrix} \quad (2)$$

$$M_{refl} = \begin{bmatrix} 1 & 0 \\ -2 \cdot c_i & -1 \end{bmatrix} \quad (3)$$

where $d_i$ is the distance to the next surface and $c_i$ the curvature of the surface, which is positive if the center of the sphere is on the right side of the surface. The path of a ray is given by a vector made of a height (distance from the optical axis) and an angle: [height, angle]. The multiplication of the vector with one or more matrices gives the ray after the corresponding translations or reflections.

The system matrix is the multiplication of all the matrices in the system. The first matrix is the reflection matrix of the first surface, the penultimate matrix is the translation matrix of the thickness preceding the last reflective surface and the last matrix is the reflection matrix of the last reflective surface. The effective focal length, the back focal length, the front focal length and the paraxial image distance can be derived from the system matrix as follows.

If the system matrix is defined as:

$$M_{system} = \begin{bmatrix} a & b \\ c & d \end{bmatrix} \quad (4)$$

then the effective focal length is given by:

$$efl = -\frac{1}{c} \quad (5)$$

the back focal length is given by:

$$bfl = -\frac{a}{c} \quad (6)$$

the front focal length is given by:

$$ffl = \frac{d}{c} \quad (7)$$

and the paraxial image distance, i.e. the distance between the last reflective surface and the image plane, is given by:

$$d_n = \frac{a \cdot d_0 + b}{c \cdot d_0 + d} \quad (8)$$

where $$d_0 = \frac{ad - cb - magn \cdot d}{magn \cdot c}$$

and magn is the magnification of the system.

The system matrix for the first part of the system, from the object plane to the stop (pupil) can be represented as:

$$M_{1st} = \begin{bmatrix} a_{1st} & b_{1st} \\ c_{1st} & d_{1st} \end{bmatrix} \quad (9)$$

so that the distance, $L_{enpup}$, to the entrance pupil is given by:

$$\begin{bmatrix} a_{1st} & b_{1st} \\ c_{1st} & d_{1st} \end{bmatrix} \cdot \begin{bmatrix} 1 & L_{enpup} \\ 0 & 1 \end{bmatrix} \cdot \begin{bmatrix} 0 \\ A_{enpup} \end{bmatrix} = \quad (10)$$

$$\begin{bmatrix} (a_{1st} \cdot L_{enpup} + b_{1st}) \cdot A_{enpup} \\ (c_{1st} \cdot L_{enpup} + d_{1st}) \cdot A_{enpup} \end{bmatrix} = \begin{bmatrix} 0 \\ A_{stop} \end{bmatrix}$$

The second part of the system, from stop to image surface can be represented as:

$$M_{2nd} = \begin{bmatrix} a_{2nd} & b_{2nd} \\ c_{2nd} & d_{2nd} \end{bmatrix} \quad (11)$$

so that the distance, $L_{expup}$, to the exit pupil is given by:

$$\begin{bmatrix} 1 & L_{expup} \\ 0 & 1 \end{bmatrix} \cdot \begin{bmatrix} a_{2nd} & b_{2nd} \\ c_{2nd} & d_{2nd} \end{bmatrix} \cdot \begin{bmatrix} 0 \\ A_{stop} \end{bmatrix} = \quad (12)$$

$$\begin{bmatrix} (b_{2nd} + L_{expup} \cdot d_{2nd}) \cdot A_{stop} \\ D_{2nd} \cdot A_{stop} \end{bmatrix} = \begin{bmatrix} 0 \\ A_{expup} \end{bmatrix}$$

The distances to the entrance and exit pupils, if $A_{enpup} \neq 0$, are then given by:

$$L_{enpup} = -\frac{b_{1st}}{a_{1st}} \text{ and } L_{expup} = -\frac{b_{2nd}}{d_{2nd}} \quad (13)$$

Constraints

Figure 5:
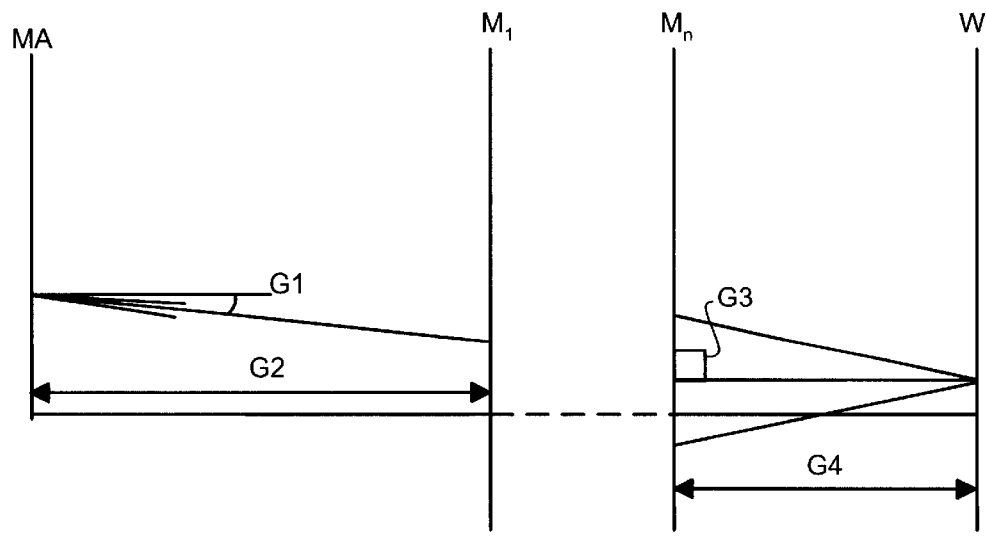
FIG. 5 is a diagram used in explaining how certain constraints are applied in designing mirror systems according to the invention.

Given the above, various constraints that must be applied to the system can be used to determine equations for the curvatures and thicknesses of certain surfaces of the system as functions of the constraints and other curvatures and thicknesses. Some example constraints G1 to G4 are shown in FIG. 5.

A first constraint G1 is minimum deviation from telecentricity on the object side that still enables obscuration-free illumination of the object, which may determine the curvature of the first surface or the thickness between mirrors 1 and 2. Another constraint G3, is perfect telecentricity on the image side, which may determine the curvature of the last surface or the thickness between the final and penultimate mirrors. This telecentricity requirement is equivalent to the requirement that the exit pupil is at infinity. The requirement that the object and the image are conjugated and have a prescribed value of the transverse magnification fixes the values of the object (G2) and image (G4) distances.

The object distance G2, the first thickness, can be solved as a function of the desired magnification of the system: the paraxial image distance is inserted in the thickness of the surface immediately preceding the image plane and the object distance is modified to satisfy:

$$M = \frac{\text{Image Height}}{\text{Object Height}} \quad (14)$$

In current lithography apparatus, M is usually set as ±0.20 or ±0.25, i.e. reduction by a factor of 5 or 4 respectively.

A minimum deviation from telecentricity at the object side is an important requirement in lithography. The reflective object (mask MA) is illuminated with a beam coming from the radiation system. The chief ray angle at the object must be such that the incident illuminating beam does not interfere with the beam reflected from the object and going into the projection system. The angle of the chief ray together with the numerical aperture on the object side should be almost zero and the angles of all rays must be smaller or larger than zero, to fulfill these two requirements. For telecentricity on the image side, the angle of the chief ray relative to the optical axis has to be zero. The size of the last mirror increases quickly as a function of the distance between the image and the last mirror, due to the relatively large numerical aperture.

A system with zero or an even number of intermediate images has a negative magnification. To have an overall system with a positive magnification the number of intermediate images has to be odd.

The working distance at the object side is the minimum distance between the object plane and the surface closest to the object, most of the time the second mirror. On the image side the working distance is the minimum distance between the image plane and the plane closest to the image, most often the penultimate mirror. The working distances provide room for mirror supports and for mechanical movements of the object and the image and must not be too small.

An example of applying the above constraints in a six-mirror system is described below. This may be carried out in practice using software such as Maple(TM) produced by Waterloo Maple Inc. 57 Erb Street W. Waterloo, Ontario Canada N2L 6C2.

First is a derivation of the formulas used for a six-mirror system, but the formulas are also valid for other numbers of mirrors, using the paraxial approach. In the matrix notation a ray is defined by the vector: [height, angle in radians]. After a distance $d_i$ the ray [y,a] will be:

$$\begin{bmatrix} y + d_i a \\ a \end{bmatrix} \quad (15)$$

using the matrix given in equation (2).

After a mirror with curvature $c_i$ the ray [y,a] will have the same height but a different angle:

$$\begin{bmatrix} v \\ -2c_i v - a \end{bmatrix} \quad (16)$$

using the matrix given in equation (3).

To derive formulas used later on, firstly the distance between mirror 5 and 6 is solved by requiring telecentricity in the image of the ray going through the optical axis in the stop surface. The following matrix A is from the stop surface to after the 5th mirror, as we don't now where we will locate the stop surface we take an unknown 2 by 2 matrix:

$$A := \begin{bmatrix} a & b \\ c & d \end{bmatrix} \quad (17)$$

From the 5th mirror we travel a distance la to the 6th mirror, la is the variable to solve now.

$$L6 := \begin{bmatrix} 1 & la \\ 0 & 1 \end{bmatrix} \quad (18)$$

Matrix MC is of the 6th mirror surface:

$$MC := \begin{bmatrix} 1 & 0 \\ -2c6 & -1 \end{bmatrix} \quad (19)$$

The ray going through the center of the stop with an arbitrary angle ap is:

$$Y := \begin{bmatrix} 0 \\ ap \end{bmatrix} \quad (20)$$

That ray after the 6th mirror will be:

$$Y\_image := \begin{bmatrix} (b + la\, d)ap \\ (-2c6 + (-2c6\, la - 1)d)ap \end{bmatrix} \quad (21)$$

in which the angle is equal to zero since telecentricity is required and the solution opl for the distance la between mirror five and six is now $$opl := -\frac{1}{2} \frac{2c6\, b + d}{c6\, d} \quad (22)$$

The matrix from the stop surface to after the 6th mirror is now:

$$B := \begin{bmatrix} \frac{1}{2} \frac{2c6\, ad - 2c6\, bc - cd}{c6\, d} & -\frac{1}{2} \frac{d}{c6} \\ -2 \frac{c6(da - bc)}{d} & 0 \end{bmatrix} \quad (23)$$

The next solve is the distance d between the object and the first mirror and the solve ya for the angle of the chief ray (going through the center of the stop) between the object and the first mirror.

The ray Ya in the object point yob with the desired angle ya is given by the vector:

$$Ya := \begin{bmatrix} yob \\ ya \end{bmatrix} \quad (24)$$

and the distance l between the object and the first mirror surface by the matrix:

$$L := \begin{bmatrix} 1 & l \\ 0 & 1 \end{bmatrix} \quad (25)$$

The first mirror surface is given by:

$$MC := \begin{bmatrix} 1 & 0 \\ -2cl & -1 \end{bmatrix} \quad (26)$$

The distance m between the first mirror and the second mirror is given by:

$$M := \begin{bmatrix} 1 & m \\ 0 & 1 \end{bmatrix} \quad (27)$$

The unknown matrix from the second mirror surface to the stop position is defined as $$A := \begin{bmatrix} e & f \\ g & h \end{bmatrix} \quad (28)$$

The chief ray in the stop surface is now:

$$Y\_stop := \quad (29)$$

$$\begin{bmatrix} (e - 2(em + f)cl)yob + ((e - 2(em + f)cl)l - em - f)ya \\ (g - 2(gm + h)cl)yob + ((g - 2(gm + h)cl)l - gm - h)ya \end{bmatrix}$$

and in the image the chief ray is:

$$Y\_image := \left[ \left( \frac{1}{2} \frac{(2c6\,ad - 2c6\,bc - cd)e}{c6\,d} - \frac{1}{2} \frac{d\,g}{c6} - \right. \right. \quad (30)$$

$$2\left(\left(\frac{1}{2}\frac{(2c6\,ad - 2c6\,bc - cd)e}{c6\,d} - \frac{1}{2}\frac{d\,g}{c6}\right)m + \right.$$

$$\left. \frac{1}{2}\frac{(2c6\,ad - 2c6\,bc - cd)f}{c6\,d} - \frac{1}{2}\frac{d\,h}{c6} \right)cl \bigg)yob +$$

$$\left(\left(\frac{1}{2}\frac{(2c6\,ad - 2c6\,bc - c\,d)e}{c6\,d} - \frac{1}{2}\frac{d\,g}{c6} - \right. \right.$$

$$2\left(\left(\frac{1}{2}\frac{(2c6\,ad - 2c6\,bc - c\,d)e}{c6\,d} - \frac{1}{2}\frac{d\,g}{c6}\right)m + \right.$$

$$\left. \frac{1}{2}\frac{(2c6\,ad - 2c6\,bc - c\,d)f}{c6\,d} - \frac{1}{2}\frac{d\,h}{c6} \right)cl \bigg)l -$$

$$\left(\frac{1}{2}\frac{(2c6\,ad - 2c6\,bc - c\,d)e}{c6\,d} - \frac{1}{2}\frac{d\,g}{c6}\right)m -$$

$$\left. \frac{1}{2}\frac{(2c6\,ad - 2c6\,bc - c\,d)f}{c6\,d} + \frac{1}{2}\frac{d\,h}{c6} \right)yz \right]$$

$$\left[ \left( -2\frac{c6(da - bc)e}{d} - 2\left(-2\frac{c6(da - bc)e\,m}{d} - \right. \right. \right.$$

$$\left. 2\frac{c6(da - bc)f}{d}\right)cl\bigg)yob + \left(\left(-2\frac{c6(da - bc)e}{d} - \right. \right.$$

-continued
$$2\left(-2\frac{c6\,(da-bc)\,em}{d}-2\frac{c6\,(da-bc)\,f}{d}\right)c1\right)l+$$
$$2\frac{c6\,(da-bc)\,em}{d}+2\frac{c6\,(da-bc)\,f}{d}\right)yz\right]$$

The height of the chief ray in the image is by definition magn*height in the object surface (yob), we solve l from equation (30) to impose this reduction to the system giving:

$$Y\_image\_l := -(2\,yob\,e\,c6\,a\,d - 2\,yob\,e\,c6\,b\,c - yob\,e\,c\,d - \quad (31)$$
$$yob\,d^2\,g - 4\,yob\,c1\,m\,e\,c6\,a\,d + 4\,yob\,c1\,m\,e\,c6\,b\,c +$$
$$2\,yob\,c1\,m\,e\,c\,d + 2\,yob\,c1\,m\,d^2\,g - 4\,yob\,c1\,f\,c6\,a\,d +$$
$$4\,yob\,c1\,f\,c6\,b\,c + 2\,yob\,c1\,f\,c\,d + 2\,yob\,c1\,d^2\,h -$$
$$2\,ya\,m\,e\,c6\,a\,d + 2\,ya\,m\,e\,c6\,b\,c + ya\,m\,e\,c\,d +$$
$$ya\,m\,d^2\,g - 2\,ya\,f\,c6\,a\,d + 2\,ya\,f\,c6\,b\,c + ya\,f\,c\,d +$$
$$ya\,d^2\,h - 2\,magn\,yob\,c6\,d)/$$
$$((2\,e\,c6\,a\,d - 2\,e\,c6\,b\,c - e\,c\,d - d^2\,g - 4\,c1\,m\,e\,c6\,a\,d +$$
$$4\,c1\,m\,e\,c6\,b\,c + 2\,c1\,m\,e\,c\,d + 2\,c1\,m\,d^2\,g -$$
$$4\,c1\,f\,c6\,a\,d + 4\,c1\,f\,c6\,b\,c + 2\,c1\,f\,c\,d + 2\,c1\,d^2\,h)ya)$$

and we force the height of the chief ray to be zero in the stop surface in equation (29), as it should be by definition to solve the distance m $$Y\_stop\_m := -\frac{-yob\,e + 2\,yob\,f\,c1 - ya\,l\,e + 2\,ya\,l\,f\,c1 + ya\,f}{e\,(2\,yob\,c1 + 2\,ya\,c1\,l + ya)} \quad (32)$$

The solution for the distance m between the first and the second mirror now becomes:

$$Y\_stop\_m := \frac{1}{4}\frac{-4\,f\,c1\,magn\,yob\,c6 + 2\,e\,magn\,yob\,c6 -}{e\,c1\,magn\,yob\,c6} \quad (33)$$

The solution for the distance m between the object and the first mirror now is:

$$Y\_image\_l := -\frac{1}{2}\frac{ya\,f\,d\,g + 2\,d\,yob\,c1\,f\,g - e\,ya\,d\,h -}{ya\,(f\,g - e\,h)\,c1\,d} \quad (34)$$

We substitute the just derived expressions in the matrices L and M of equations (25) and (27).

$$M := \begin{bmatrix} 1 & \frac{1}{4}\frac{-4\,f\,c1\,magn\,yob\,c6 + 2\,e\,magn\,yob\,c6 -}{e\,c1\,magn\,yob\,c6} \\ 0 & 1 \end{bmatrix} \quad (35)$$

$$L := \begin{bmatrix} 1 & -\frac{1}{2}\frac{ya\,f\,d\,g + 2\,d\,yob\,c1\,f\,g - e\,ya\,d\,h -}{ya\,(f\,g - e\,h)\,c1\,d} \\ 0 & 1 \end{bmatrix} \quad (36)$$

And as a check we calculate the chief ray after the 6th surface with the new expressions. We see that the angle is always zero and that the height is the object height multiplied with magnification.

$$Y\_image := \begin{bmatrix} magn\,yob \\ 0 \end{bmatrix} \quad (37)$$

The final solve is the distance n between the last mirror surface and the image surface. In the image surface all rays from the same object point come together in a point with a height=magnification*object height.

First we define a ray Yb from the object point yob and an arbitrary angle yb.

$$Yb := \begin{bmatrix} yob \\ yb \end{bmatrix} \quad (38)$$

$$N := \begin{bmatrix} 1 & n \\ 0 & 1 \end{bmatrix} \quad (39)$$

In the image this ray Yb will become:

$$Y\_image := \left[-\frac{1}{4}(-f\,g^2\,d^2\,ya^2 + g\,d^2\,e\,ya^2\,h - g\,yb\,d^2\,e\,ya\,h + \quad (40)\right.$$
$$2\,yb\,e^2\,c6\,a\,d\,ya\,h - 4\,yb\,magn^2\,yob\,c6^2\,e -$$
$$4\,yb\,e^2\,n\,c6^2\,d\,a\,ya\,h + 4\,yb\,e^2\,n\,c6^2\,b\,c\,ya\,h +$$
$$e^2\,c\,d\,ya^2\,h - 4\,e^2\,n\,c6^2\,b\,c\,ya^2\,h +$$
$$4\,e^2\,n\,c6^2\,d\,a\,ya^2\,h + 2\,e^2\,c6\,b\,c\,ya^2\,h -$$
$$2\,e^2\,c6\,a\,d\,ya^2\,h - 2\,yb\,e^2\,c6\,b\,c\,ya\,h -$$
$$4\,ya\,d\,c1\,magn\,yob\,c6\,e\,h + 4\,yb\,d\,c1\,magn\,yob\,c6\,e\,h -$$
$$yb\,e^2\,c\,d\,ya\,h + f\,g^2\,yb\,d^2\,ya + f\,g\,yb\,e\,c\,d\,ya -$$
$$4\,f\,g\,e\,n\,c6^2\,d\,a\,ya^2 + 2\,f\,g\,yb\,e\,c6\,b\,c\,ya -$$
$$2\,f\,g\,e\,c6\,b\,c\,ya^2 - 4\,f\,g\,yb\,d\,c1\,magn\,yob\,c6 +$$
$$2\,f\,g\,e\,c6\,a\,d\,ya^2 + 4\,f\,g\,ya\,d\,c1\,magn\,yob\,c6 +$$
$$4\,f\,g\,e\,n\,c6^2\,b\,c\,ya^2 - f\,g\,e\,c\,d\,ya^2 +$$
$$4\,f\,g\,yb\,e\,n\,c6^2\,d\,a\,ya - 4\,f\,g\,yb\,e\,n\,c6^2\,b\,c\,ya -$$
$$2\,f\,g\,yb\,e\,c6\,a\,d\,ya)/(ya\,magn\,e\,c6^2)\right]$$

$$\left[-\frac{(-ya + yb)(f\,g - e\,h)(d\,a - b\,c)}{magn}\right]$$

The expression for the image distance n is, given that the image height is equal to magn. yob:

$$Y\_image\_n := -\frac{1}{4}(-d^2\,g\,e\,ya\,h + 2\,e^2\,c6\,a\,d\,ya\,h - \quad (41)$$
$$4\,magn^2\,yob\,c6^2\,e + 2\,e\,c6\,b\,c\,ya\,f\,g -$$
$$4\,d\,g\,f\,c1\,magn\,yob\,c6 - 2\,e^2\,c6\,b\,c\,ya\,h +$$
$$e\,c\,d\,ya\,f\,g + 4\,d\,h\,c6\,e\,c1\,magn\,yob - e^2\,c\,d\,ya\,h +$$
$$d^2\,g^2\,ya\,f - 2\,e\,c6\,a\,d\,ya\,f\,g)/$$
$$((-e\,d\,a\,h + e\,b\,c\,h + f\,g\,d\,a - f\,g\,b\,c)\,e\,c6^2\,ya)$$

6-mirror system, stop on mirror 2

Now we use these derivations in the first part: solving the variables of a six-mirror system with the stop position on mirror two, defining thicknesses as d:=[d0,d1,d2,d3,d4,d5,d6] and the curvatures as c=[c1,c2,c3,c4,c5,c6]. The stop (pupil) position is on the second surface.

A limitation on the Petzval sum (i.e. the sum of curvatures in the system, curvatures of odd surfaces being subtracted from curvatures of even surfaces, or vice versa), e.g. to be zero, can be introduced and used to solve the curvature of the stop surface. However, a zero Petzval sum is not essential and an non-zero value can be accommodated.

Now we define all the matrices in the system, the reflectance (even subscripts) and translation (odd subscripts) matrices, from the object to the image.

$$M_1 := \begin{bmatrix} 1 & d0 \\ 0 & 1 \end{bmatrix} \quad M_2 := \begin{bmatrix} 1 & 0 \\ -2c1 & -1 \end{bmatrix} \quad (42)$$

$$M_3 := \begin{bmatrix} 1 & d1 \\ 0 & 1 \end{bmatrix} \quad M_4 := \begin{bmatrix} 1 & 0 \\ -2c2 & -1 \end{bmatrix}$$

$$M_5 := \begin{bmatrix} 1 & d2 \\ 0 & 1 \end{bmatrix} \quad M_6 := \begin{bmatrix} 1 & 0 \\ -2c3 & -1 \end{bmatrix}$$

$$M_7 := \begin{bmatrix} 1 & d3 \\ 0 & 1 \end{bmatrix} \quad M_8 := \begin{bmatrix} 1 & 0 \\ -2c4 & -1 \end{bmatrix}$$

$$M_9 := \begin{bmatrix} 1 & d4 \\ 0 & 1 \end{bmatrix} \quad M_{10} := \begin{bmatrix} 1 & 0 \\ -2c5 & -1 \end{bmatrix}$$

$$M_{11} := \begin{bmatrix} 1 & d5 \\ 0 & 1 \end{bmatrix} \quad M_{12} := \begin{bmatrix} 1 & 0 \\ -2c6 & -1 \end{bmatrix}$$

$$M_{13} := \begin{bmatrix} 1 & d6 \\ 0 & 1 \end{bmatrix}$$

The first solve is the exit pupil in infinity or telecentricity in the image. The angle of the ray going through the optical axis in the stop surface should be zero in the image. The matrix from the stop surface to the fifth mirror generated by multiplication of the appropriate M matrices derived just above, is given by:

$$|1 - 2d3\,c3 + d4(-2c4(1 - 2d3\,c3) + 2c3),\, d2 + d3(-2c3\,d2 - 1) + \quad (43)$$
$$d4(-2c4(d2 + d3(-2c3\,d2 - 1)) + 2c3\,d2 + 1)|$$
$$[-2c5(1 - 2d3\,c3 + d4(-2c4(1 - 2d3\,c3) + 2c3)) +$$
$$2c4(1 - 2d3\,c3 - 2c3, -2c5(d2 + d3(-2c3\,d2 - 1) +$$
$$d4(-2c4(d2 + d3(-2c3\,d2 - 1)) + 2c3\,d2 + 1)) +$$
$$2c4(d2 + d3(-2c3\,d2 - 1)) - 2c3\,d2 - 1|$$

The matrix from the second mirror surface to the stop surface is given by:

$$\begin{bmatrix} 1 & 0 \\ -2c2 & -1 \end{bmatrix} \quad (44)$$

So as we derived the distance between mirror 5 and 6, we solve this new found value in the appropriate matrix and the vector of distances.

$$d5 := -\frac{1}{2}(2c6\,d2 - 4c6\,d3\,c3\,d2 - 2c6\,d3 - 4c6\,d4\,c4\,d2 + \quad (45)$$
$$8c6\,d4\,c4\,d3\,c3\,d3 + 4c6\,d4\,c3\,d2 + 2c6\,d4 -$$
$$2c5\,d3\,c3\,d2 + 2c5\,d3 + 4c5\,d4\,c4\,d2 -$$
$$8c5\,d4\,c4\,d3\,c3\,d2 - 4c5\,d4\,c4\,d3 -$$
$$4c5\,d4\,c3\,d2 - 2c4\,d3\,c3\,d2 - 2c4\,d3 -$$
$$2c3\,d2 - 1)/(c6\,(2c5\,d2 - 4c5\,d3\,c3\,d2 -$$
$$2c5\,d3 - 4c5\,d4\,c4\,d2 + 8c5\,d4\,c\,d3\,c3\,d2 +$$
$$4c5\,d4\,c4\,d3 + 4c5\,d4\,c3\,d2 + 2c5\,d4 -$$
$$2c4\,d2 + 4c4\,d3\,c3\,d2 + 2c4\,d3 + 2c3\,d2 + 1))$$

The distance between mirror one and two is derived as:

$$d1 := -\frac{1}{4}\frac{\begin{array}{l}-2\,magn\,yob\,c6 - angle\,(-2c5(d2 + d3(-2c3\,d2 - 1) + \\ d4(-2c4(d2 + d3(-2c3\,d2 - 1)) + \\ 2c4(d2 + d3(-2c3\,d2 - 1)) - 2c3\,d2 - 1)\end{array}}{c1\,magn\,yob\,c6} \quad (46)$$

and the distance between the object and the first mirror is:

$$d0 := \frac{1}{2}(-angle\,(-2c5\,(d2 + d3(-2c3\,d2 - 1) + \quad (47)$$
$$d4(-2c4(d2 + d3(-2c3\,d2 - 1)) + 2c3\,d2 + 1)) +$$
$$2c4\,(d2 + d3(-2c3\,d2 - 1)) - 2c3\,d2 - 1) -$$
$$2c1\,yob\,(-2c5\,(d2 + d3(-2c3\,d2 - 1) +$$
$$d4(-2c4(d2 + d3(-2c3\,d2 - 1)) +$$
$$2c3\,d2 + 1)) + 2c4\,(d2 + d3(-2c3\,d2 - 1)) -$$
$$2c3\,d2 - 1) - 2\,magn\,yob\,c6)/(angle\,c1\,(-2c5\,(d2 +$$
$$d3(-2c3\,d2 - 1) + d4(-2c4(d2 + d3(-2c3\,d2 -$$
$$1)) + 2c3\,d2 + 1)) + 2c4\,(d2 + d3(-2c3\,d2 - 1)) -$$
$$2c3\,d2 - 1))$$

The distance between mirror six and the image surface is:

$$d6 := -\frac{1}{4}(2\,angle\,(1 - 2d3c3 + d4(-2c4(1 - 2d3c3) + \quad (48)$$
$$2c3))c6(-2c5(d2 + d3(-2c3d2 - 1) + d4(-2c4(d2 +$$
$$d3(-2c3d2 - 1)) + 2c3d2 + 1)) + 2c4(d2 +$$
$$d3(-2c3d2 - 1)) - 2c3d2 - 1) -$$
$$2\,angle\,(-2c5(1 - 2d3c3 + d4(-2c4(1 - 2d3c3) + 2c3)) +$$
$$2c4(1 - 2d3c3) - 2c3)c6(d2 + d3(-2c3d2 - 1) +$$
$$d4(-2c4(d2 + d3(-2c3d2 - 1)) + 2c3d2 + 1)) -$$
$$angle\,(-2c5(1 - 2d3c3 + d4(-2c4(1 - 2d3c3) + 2c3)) +$$
$$2c4(1 - 2d3c3) - 2c3)(-2c5(d2 + d3(-2c3d2 - 1) +$$
$$d4(-2c4(d2 + d3(-2c3d2 - 1)) + 2c3d2 + 1)) +$$
$$2c4(d2 + d3(-2c3d2 - 1)) - 2c3d2 - 1) +$$
$$2\,angle\,(-2c5(d2 + d3(-2c3d2 - 1) +$$
$$d4(-2c4(d2 + d3(-2c3d2 - 1)) + 2c3d2 + 1)) +$$
$$2c4(d2 + d3(-2c3d2 - 1)) - 2c3d2 - 1)^2 c2 +$$
$$4c1(-2c5(d2 + d3(-2c3d2 - 1) +$$
$$d4(-2c4(d2 + d3(-2c3d2 - 1)) + 2c3d2 + 1)) +$$
$$2c4(d2 + d3(-2c3d2 - 1)) - 2c3d2 - 1)\,magn\,yob\,c6 +$$
$$4\,magn^2\,yob\,c6^2)/(((-2c5(1 - 2d3c3) + d4(-2c4(1 -$$
$$2d3c3) + 2c3)) + 2c4(1 - 2d3c3) - 2c3)(d2 + d3(-2c3d2 - 1) +$$
$$d4(-2c4(d2 + d3(-2c3d2 - 1)) + 2c3d2 + 1)) -$$

-continued
$$(-2c5(d2 + d3(-2c3d2 - 1) + d4(-2c4(d2 +$$
$$d3(-2c3d2 - 1)) + 2c3d2 + 1)) + 2c4(d2 + d3(-2c3d2 - 1)) -$$
$$2c3d2 - 1)(1 - 2d3c3 + d4(-2c4(1 - 2d3c3) + 2c3)))c6^2 \text{ angle})$$

The variable angle is identical to ya introduced in equation (24) above.

6-Mirror System, Stop on Mirror 3

The original derivations can similarly be used to solve the variables of a six-mirror system with the stop position on mirror three, as will now be shown.

The first solve is pupil in infinity or telecentricity in the image. The angle of the ray going through the optical axis in the stop surface should be zero in the image. The matrix from the stop surface to the fifth mirror generated by multiplication of the appropriate M matrices derived just above, is given by:

$$\begin{bmatrix} 1 - 2d4c4 & d3 + d4(-2c4d3 - 1) \\ -2c5(1 - 2d4c4) + 2c4 & -2c5(d3 + d4(-2c4d3 - 1)) + 2c4d3 + 1 \end{bmatrix} \quad (50)$$

The matrix from the second mirror surface to the stop surface is given by:

$$\begin{bmatrix} 1 - 2d2c2 & -d2 \\ -2c3(1 - 2d2c2) + 2c2 & 2c3d2 + 1 \end{bmatrix} \quad (51)$$

So, as derived above, the distance between mirror 5 and 6 is, solved this new found value in the appropriate matrix and the vector of distances:

$$d5 := -\frac{1}{2} \frac{2c6d3 - 4c6d4c4d3 - 2c6d4 - 2c5d3 + 4c5d4c4d3 + 2c5d4 + 2c4d3 + 1}{c6(-2c5d3 + 4c5d4c4d3 + 2c5d4 + 2c4d3 + 1)} \quad (51)$$

The distance between mirror one and two was:

$$d1 := -\frac{1}{4}(-4d2c1 \text{ magn yob } c6 - 2(1 - 2d2c2) \text{ magn yob } c6 + \quad (52)$$
$$(1 - 2d2c2) \text{ angle } (-2c5(d3 + d4(-2c4d3 - 1)) +$$
$$2c4d3 + 1)(2c3d2 + 1) + \text{ angle } d2(-2c5(d3 + d4(-2c4d3 -$$
$$1)) + 2c4d3 + 1)(-2c3(1 - 2d2c2) + 2c2))/((1 -$$
$$2d2c2)c1 \text{ magn yob } c6)$$

And the distance between the object and the first mirror:

$$d0 := -\frac{1}{2}((1 - 2d2c2) \text{ angle } (-2c5(d3 + d4(-2c4d3 - 1)) + \quad (53)$$
$$2c4d3 + 1)(2c3d2 + 1) + \text{ angle } d2(-2c5(d3 + d4(-2c4d3 -$$
$$1)) + 2c4d3 + 1)(-2c3(1 - 2d2c2) + 2c2) +$$
$$2c1 \text{ yob } d2(-2c5(d3 + d4(-2c4d3 - 1)) + 2c4d3 + 1)(-2c3(1 -$$
$$2d2c2) + 2c2) + 2c1 \text{ yob } (1 - 2d2c2)(-2c5(d3 +$$
$$d4(-2c4d3 - 1)) + 2c4d3 + 1)(2c3d2 + 1) -$$

-continued
$$2(1 - 2d2c2) \text{ magn yob } c6)/(\text{angle } ((-2c3(1 - 2d2c2) +$$
$$2c2)d2 + (2c3d2 + 1)(1 - 2d2c2))c1(-2c5(d3 +$$
$$d4(-2c4d3 - 1)) + 2c4d3 + 1))$$

And the distance between mirror six and the image surface:

$$d6 := -\frac{1}{4}(-2 \text{ angle } (1 - 2d2c2)^2(1 - 2d4c4)c6(-2c5(d3 + \quad (54)$$
$$d4(-2c4d3 - 1)) + 2c4d3 + 1)(2c3d2 +$$
$$1) - 2 \text{ angle } (1 - 2d2c2)(1 - 2d4c4)c6(-2c5(d3 +$$
$$d4(-2c4d3 - 1)) + 2c4d3 + 1)d2(-2c3(1 - 2d2c2) +$$
$$2c2) + 2 \text{ angle } (1 - 2d2c2)^2(-2c5(1 - 2d4c4) +$$
$$2c4)c6(d3 + d4(-2c4d3 - 1))(2c3d2 + 1) +$$
$$2 \text{ angle } (1 - 2d2c2)(-2c5(1 - 2d4c4) + 2c4)c6(d3 +$$
$$d4(-2c4d3 - 1))d2(-2c3(1 - 2d2c2) + 2c2) +$$
$$\text{angle } (1 - 2d2c2)^2(-2c5(1 - 2d4c4) +$$
$$2c4)(-2c5(d3 + d4(-2c4d3 - 1)) + 2c4d3 + 1)(2c3d2 + 1 +$$
$$\text{angle } (1 - 2d2c2)(-2c5(1 - 2d4c4) + 2c4)(-2c5(d3 +$$
$$d4(-2c4d3 - 1)) + 2c4d3 + 1)d2(-2c3(1 - 2d2c2) +$$
$$2c2) + \text{ angle } (-2c5(d3 + d4(-2c4d3 - 1)) + 2c4d3 +$$
$$1)^2(-2c3(1 - 2d2c2) + 2c2)(1 - 2d2c2)(2c3d2 + 1) +$$
$$\text{angle } (-2c5(d3 + d4(-2c4d3 - 1)) + 2c4d3 + 1)^2(-2c3(1 -$$
$$2d2c2) + 2c2)^2d2 - 4(-2c5(d3 + d4(-2c4d3 - 1)) +$$
$$2c4d3 + 1)(-2c3(1 - 2d2c2) + 2c2)d2c1 \text{ magn yob } c6 -$$
$$4c1(-2c5(d3 + d4(-2c4d3 - 1)) + 2c4d3 + 1)(2c3d2 +$$
$$1)(1 - 2d2c2) \text{ magn yob } c6 + 4 \text{ magn}^2 \text{ yob } c6^2(1 -$$
$$2d2c2))/(((-2c5(d3 + d4(-2c4d3 - 1)) + 2c4d3 +$$
$$1)(1 - 2d4c4)d2(-2c3(1 - 2d2c2) + 2c2) - (-2c5(1 -$$
$$2d4c4) + 2c4)(d3 + d4(-2c4d3 - 1))d2(-2c3(1 -$$
$$2d2c2) + 2c2) - (2c3d2 + 1)(1 - 2d2c2)(-2c5(1 - 2d4c4) +$$
$$2c4)(d3 + d4(-2c4d3 - 1)) + (2c3d2 + 1)(1 -$$
$$2d2c2)(-2c5(d3 + d4(-2c4d3 - 1)) + 2c4d3 +$$
$$1)(1 - 2d4c4))(1 - 2d2c2)c6^2 \text{ angle})$$

6-Mirror System, Stop on Mirror 4

Similarly, the original derivations can be used to solve the variables of a six-mirror system with the stop position on mirror four.

Again, the first solve is pupil in infinity or telecentricity in the image. The angle of the ray going through the optical axis in the stop surface should be zero in the image. The matrix from the stop surface to the fifth mirror generated by multiplication of the appropriate M matrices derived above is given by:

$$\begin{bmatrix} 1 & d4 \\ -2c5 & -2c5d4 - 1 \end{bmatrix} \quad (55)$$

The matrix from the second mirror surface to the stop surface is given by:

$$\begin{bmatrix} 1-2d2c2+d3(-2c3(1-\\ 2d2c2)+2c2) & -d2+d3(2c3d2+1) \\ -2c4(1-2d2c2+d3(-2c3(1-\\ 2d2c2)+2c2))+2c3(1-2d2c2)-2c2 & -2c4(-d2+d3(2c3d2+\\ 1))-2c3d2-1 \end{bmatrix} \quad (56)$$

So, as derived above, the distance between mirror 5 and 6, solved in the appropriate matrix and the vector of distances, is:

$$d5 := -\frac{1}{2}\frac{-2c6d4+2c5d4+1}{c6(2c5d4+1)} \quad (57)$$

The distance between mirror one and two is:

$$d1 := -\frac{1}{4}(4(-d2+d3(2c3d2+1))c1\ magn\ yob\ c6 - 2(1- \quad (58)$$
$$2d2c2+d3(-2c3(1-2d2c2)+2c2))\ magn\ yob\ c6 +$$
$$(1-2d2c2+d3(-2c3(1-2d2c2)+$$
$$2c2))\ angle\ (-2c5d4-1)(-2c4(-d2+d3(2c3d2+$$
$$1))-2c3d2-1) - angle\ (-d2+d3(2c3d2+1))(-2c5d4-$$
$$1)(-2c4(1-2d2c2+d3(-2c3(1-2d2c2)+2c2))+$$
$$2c3(1-2d2c2)-2c2))/((1-2d2c2+d3(-2c3(1-$$
$$2d2c2)+2c2))c1\ magn\ yob\ c6)$$

And the distance between the object and the first mirror:

$$d0 := -\frac{1}{2}((1-2d2c2+d3(-2c3(1-2d2c2)+ \quad (59)$$
$$2c2))\ angle\ (-2c5d4-1)(-2c4(-d2+$$
$$d3(2c3d2+1))-2c3d2-1) - angle\ (-d2+$$
$$d3(2c3d2+1))(-2c5d4-1)(-2c4(1-2d2c2+$$
$$d3(-2c3(1-2d2c2)+2c2))+2c3(1-2d2c2)-$$
$$2c2)-2c1\ yob\ (-d2+d3(2c3d2+1))(-2c5d4-$$
$$1)(-2c4(1-2d2c2+d3(-2c3(1-2d2c2)+$$
$$2c2))+2c3(1-2d2c2)-2c2)+2c1\ yob\ (1-$$
$$2d2c2+d3(-2c3(1-2d2c2)+2c2))(-2c5d4-$$
$$1)(-2c4(-d2+d3(2c3d2+1))-2c3d2-1)-$$
$$2(1-2d2c2+d3(-2c3(1-2d2c2)+$$
$$2c2))\ magn\ yob\ c6)/(angle\ (-(-2c4(1-$$
$$2d2c2+d3(-2c3(1-2d2c2)+2c2))+$$
$$2c3(1-2d2c2)-2c2)(-d2+d3(2c3d2+$$
$$1))+(-2c4(-d2+d3(2c3d2+1))-2c3d2-1)(1-$$
$$2d2c2+d3(-2c3(1-2d2c2)+2c2)))c1(-2c5d4-1))$$

And the distance between mirror six and the image surface:

$$d6 := -\frac{1}{4}(-2\ angle\ (1-2d2c2+d3(-2c3(1-2d2c2)+2c2))^2 \quad (60)$$
$$c6\ (-2c5d4-1)(-2c4(-d2+d3(2c3d2+1))-2c3d2-1)+$$
$$2\ angle\ (1-2d2c2+d3(-2c3(1-2d2c2)+2c2))$$
$$c6\ (-2c5d4-1)(-d2+d3(2c3d2+1))$$
$$(-2c4(1-2d2c2+d3(-2c3(1-2d2c2)+2c2))+$$
$$2c3(1-2d2c2)-2c2)-4\ angle$$
$$(1-2d2c2+d3(-2c3(1-2d2c2)+2c2))^2 c5\ c6\ d4$$
$$(-2c4(-d2+d3(2c3d2+1))-2c3d2-1)+4\ angle$$
$$(1-2d2c2+d3(-2c3(1-2d2c2)+2c2))c5\ c6\ d4$$
$$(-d2+d3(2c3d2+1))(-2c4(1-2d2c2+$$
$$d3(-2c3(1-2d2c2)+2c2))+2c3(1-2d2c2)-2c2)-$$
$$2\ angle\ (1-2d2c2+d3(-2c3(1-2d2c2)+2c2))^2$$
$$c5\ (-2c5d4-1)(-2c4(-d2+d3(2c3d2+1))-2c3d2-1)+$$
$$2\ angle(1-2d2c2+d3(-2c3(1-2d2c2)+2c2))$$
$$c5(-2c5d4-1)(-d2+d3(2c3d2+1))$$
$$(-2c4(1-2d2c2+d3(-2c3(1-2d2c2)+2c2))+$$
$$2c3(1-2d2c2)-2c2)+angle\ (-2c5d4-1)^2$$
$$(-2c4(1-2d2c2+d3(-2c3(1-2d2c2)+2c2))+$$
$$2c3(1-2d2c2)-2c2)(1-2d2c2+d3(-2c3(1-2d2c2)+$$
$$2c2))(-2c4(-d2+d3(2c3d2+1))-2c3d2-1)-$$
$$angle\ (-2c5d4-1)^2(-2c4(1-2d2c2+$$
$$(d3(-2c3(1-2d2c2)+2c2))+2c3(1-2d2c2)-2c2))^2$$
$$(-d2+d3(2c3d2+1))+4(-2c5d4-1)$$
$$(-2c4(1-2d2c2+d3(-2c3(1-2d2c2)+2c2))+$$
$$2c3(1-2d2c2)-2c2)(-d2+d3(2c3d2+1))$$
$$c1\ magn\ yob\ c6-4c1\ (-2c5d4-1)$$
$$(-2c4(-d2+d3(2c3d2+1))-2c3d2-1)$$
$$(1-2d2c2+d3(-2c3(1-2d2c2)+2c2))$$
$$magn\ yob\ c6+4magn^2\ yob\ c6^2(1-2d2c2+$$
$$d3(-2c3(1-2d2c2)+2c2)))/((-(-2c5d4-1)$$
$$(-d2+d3(2c3d2+1))(-2c4(1-2d2c2+$$
$$d3(-2c3(1-2d2c2)+2c2))+2c3(1-2d2c2)-2c2)-$$
$$2c5\ d4(-d2+d3(2c3d2+1))$$
$$(-2c4(1-2d2c2+d3(-2c3(1-2d2c2)+2c2))+$$
$$2c3(1-2d2c2)-2c2)+2(-2c4(-d2+d3(2c3d2+1))-$$
$$2c3\ d2-1)(1-2d2c2+d3(-2c3(1-2d2c2)+2c2))$$
$$c5\ d4+(-2c4(-d2+d3(2c3d2+1))-2c3d2-1)$$
$$(1-2d2c2+d3(-2c3(1-2d2c2)+2c2))(-2c5d4-1))$$
$$(1-2d2c2+d3(-2c3(1-2d2c2)+2c2))c6^2\ angle)$$

6-Mirror System, Stop on Mirror 5

Again, we use the original derivations to solve the variables of a six-mirror system with the stop position on mirror five. As before, the first solve is pupil in infinity or telecentricity in the image. The angle of the ray going through the optical axis in the stop surface should be zero in the image. The matrix from the stop surface to the fifth mirror generated by multiplication of the appropriate M matrices derived above is given by:

$$\begin{bmatrix} 1 & 0 \\ 0 & 1 \end{bmatrix} \quad (61)$$

The matrix from the second mirror surface to the stop surface is given by:

$$[1 - 2\,d2\,c2 + d3\,(-2\,c3\,(1 - 2\,d2\,c2) + 2\,c2) + \qquad (62)$$
$$d4\,(-2\,c4\,(1 - 2\,d2\,c2 + d3\,(-2\,c3\,(1 - 2\,d2\,c2) + 2\,c2)) +$$
$$2\,c3\,(1 - 2\,d2\,c2) - 2\,c2), -d2 + d3\,(2\,c3\,d2 + 1) +$$
$$d4\,(-2\,c4\,(-d2 + d3\,(2\,c3\,d2 + 1)) -$$
$$2\,c3\,d2 - 1)][-2\,c5\,(1 - 2\,d2\,c2 + d3\,(-2\,c3\,(1 - 2\,d2\,c2) +$$
$$2\,c2) + d4\,(-2\,c4\,(1 - 2\,d2\,c2 + d3\,(-2\,c3\,(1 -$$
$$2\,d2\,c2) + 2\,c2)) + 2\,c3\,(1 - 2\,d2\,c2) - 2\,c2)) +$$
$$2\,c4\,(1 - 2\,d2\,c2 + d3\,(-2\,c3\,(1 - 2\,d2\,c2) + 2\,c2)) -$$
$$2\,c3\,(1 - 2\,d2\,c2) + 2\,c2, -2\,c5\,(-d2 + d3\,(2\,c3\,d2 + 1) +$$
$$d4\,(-2\,c4\,(-d2 + d3\,(2\,c3\,d2 + 1)) - 2\,c3\,d2 - 1)) +$$
$$2\,c4\,(-d2 + d3\,(2\,c3\,d2 + 1)) + 2\,c3\,d2 + 1]$$

So, as derived above, the distance between mirror 5 and 6, solved in the appropriate matrix and the vector of distances: is:

$$d5 := -\frac{1}{2}\frac{1}{c6} \quad (63)$$

The distance between mirror one and two was:

$$d1 := -\frac{1}{4}(4(-d2 + d3\,(2\,c3\,d2 + 1) + d4\,(-2\,c4\,(-d2 + \qquad (64)$$
$$d3\,(2\,c3\,d2 + 1)) - 2\,c3\,d2 - 1))\,c1\,magn\,yob\,c6 -$$
$$2\,(1 - 2\,d2\,c2 + d3\,(-2\,c3\,(1 - 2\,d2\,c2) +$$
$$d4\,(-2\,c4\,(1 - 2\,d2\,c2 + d3\,(-2\,c3\,(1 - 2\,d2\,c2) +$$
$$2\,c2)) + 2\,c3\,(1 - 2\,d2\,c2) - 2\,c2))\,magn\,yob\,c6 +$$
$$(1 - 2\,d2\,c2 + d3\,(-2\,c3\,(1 - 2\,d2\,c2) + 2\,c2) +$$
$$d4\,(-2\,c4\,(1 - 2\,d2\,c2 + d3\,(-2\,c3\,(1 - 2\,d2\,c2) +$$
$$2\,c2)) + 2\,c3\,(1 - 2\,d2\,c2) - 2\,c2))\,angle\,(-2\,c5\,(-d2 +$$
$$d3\,(2\,c3\,d2 + 1) + d4\,(-2\,c4\,(-d2 + d3\,(2\,c3\,d2 + 1)) -$$
$$2\,c3\,d2 - 1)) + 2\,c4\,(-d2 + d3\,(2\,c3\,d2 + 1)) +$$
$$2\,c3\,d2 + 1) - angle\,(-d2 + d3\,(2\,c3\,d2 + 1) +$$
$$d4\,(-2\,c4\,(-d2 + d3\,(2\,c3\,d2 + 1)) -$$
$$2\,c3\,d2 - 1))(-2\,c5\,(1 - 2\,d2\,c2 + d3\,(-2\,c3\,(1 -$$
$$2\,d2\,c2) + 2\,c2) + d4\,(-2\,c4\,(1 - 2\,d2\,c2 +$$
$$d3\,(-2\,c3\,(1 - 2\,d2\,c2) + 2\,c2)) + 2\,c3\,(1 - 2\,d2\,c2) -$$
$$2\,c2)) + 2\,c4\,(1 - 2\,d2\,c2 + d3\,(-2\,c3\,(1 - 2\,d2\,c2) +$$
$$2\,c2)) - 2\,c3\,(1 - 2\,d2\,c2) + 2\,c2))/((1 - 2\,d2\,c2 +$$
$$d3\,(-2\,c3\,(1 - 2\,d2\,c2) + 2\,c2) + d4\,(-2\,c4\,(1 -$$

-continued
$$2\,d2\,c2 + d3\,(-2\,c3\,(1 - 2\,d2\,c2) + 2\,c2)) +$$
$$2\,c3\,(1 - 2\,d2\,c2) - 2\,c2))\,c1\,magn\,yob\,c6)$$

And the distance between the object and the first mirror:

$$d0 := -\frac{1}{2}((1 - 2\,d2\,c2 + d3\,(-2\,c3\,(1 - 2\,d2\,c2) + 2\,c2) + \qquad (65)$$
$$d4\,(-2\,c4\,(1 - 2\,d2\,c2 + d3\,(-2\,c3\,(1 - 2\,d2\,c2) + 2\,c2)) +$$
$$2\,c3\,(1 - 2\,d2\,c2) - 2\,c2))\,angle$$
$$(-2\,c5\,(-d2 + d3\,(2\,c3\,d2 + 1) + d4\,(-2\,c4\,(-d2 +$$
$$d3\,(2\,c3\,d2 + 1)) - 2\,c3\,d2 - 1)) +$$
$$2\,c4\,(-d2 + d3\,(2\,c3\,d2 + 1)) + 2\,c3\,d2 + 1) -$$
$$angle(-d2 + d3\,(2\,c3\,d2 + 1) + d4(-2\,c4\,(-d2 +$$
$$d3\,(2\,c3\,d2 + 1)) - 2\,c3\,d2 - 1))$$
$$(-2\,c5\,(1 - 2\,d2\,c2 + d3\,(-2\,c3\,(1 - 2\,d2\,c2) + 2\,c2) +$$
$$d4\,(-2\,c4\,(1 - 2\,d2\,c2 + d3\,(-2\,c3(1 - 2\,d2\,c2) + 2\,c2)) +$$
$$2\,c3\,(1 - 2\,d2\ c2) - 2\,c2)) + 2\,c4\,(1 - 2\,d2\,c2 +$$
$$d3\,(-2\,c3\,(1 - 2\,d2\,c2) + 2\,c2)) - 2\,c3\,(1 - 2\,d2\,c2) + 2\,c2) -$$
$$2\,c1\,yob\,(-d2 + d3\,(2\,c3\,d2 + 1) + d4\,(-2\,c4\,(-d2 +$$
$$d3\,(2\,c3\,d2 + 1)) - 2\,c3\,d2 + 1))$$
$$(-2\,c5\,(1 - 2\,d2\,c2 + d3\,(-2\,c3\,(1 - 2\,d2\,c2) + 2\,c2) +$$
$$d4\,(-2\,c4(1 - 2\,d2\,c2 + d3(-2\,c3\,(1 - 2\,d2\,c2) + 2\,c2)) +$$
$$2\,c3\,(1 - 2\,d2\,c2) - 2\,c2)) + 2\,c4\,(1 - 2\,d2\,c2 +$$
$$d3\,(-2\,c3\,(1 - 2\,d2\,c2) + 2\,c2)) - 2\,c3\,(1 - 2\,d2\,c2) + 2\,c2) +$$
$$2\,c1yob(1 - 2\,d2\,c2 + d3\,(-2\,c3\,(1 - 2\,d2\,c2) + 2\,c2) +$$
$$d4\,(-2\,c4\,(1 - 2\,d2\,c2 + d3\,(-2\,c3\,(1 - 2\,d2\,c2) +$$
$$2\,c2)) + 2\,c3\,(1 - 2\,d2\,c2) - 2\,c2))$$
$$(-2\,c5\,(-d2 + d3\,(2\,c3\,d2 + 1) + d4\,(-2\,c4\,(-d2 +$$
$$d3\,(2\,c3\,d2 + 1)) - 2\,c3\,d2 - 1)) +$$
$$2\,c4\,(-d2 + d3\,(2\,c3\,d2 + 1)) + 2\,c3\,d2 + 1) -$$
$$2\,(1 - 2\,d2\,c2 + d3\,(-2\,c3\,(1 - 2\,d2\,c2) + 2\,c2) +$$
$$d4\,(-2\,c4\,(1 - 2\,d2\,c2 + d3\,(-2\,c3\,(1 - 2\,d2\,c2) +$$
$$2\,c2)) + 2\,c3(1 - 2\,d2\,c2) - 2\,c2))\,magn\,yob\,c6) /$$
$$(angle\,(-(-2\,c5\,(1 - 2\,d2\,c2 + d3\,(-2\,c3\,(1 - 2\,d2\,c2) + 2\,c2) +$$
$$d4\,(-2\,c4\,(1 - 2\,d2\,c2 + d3\,(-2\,c3\,(1 - 2\,d2\,c2) +$$
$$2\,c2)) + 2\,c3(1 - 2\,d2\,c2) - 2\,c2)) +$$
$$2\,c4\,(1 - 2\,d2\,c2 + d3\,(-2\,c3(1 - 2\,d2\,c2) + 2\,c2)) -$$
$$2\,c3\,(1 - 2\,d2\,c2) + 2\,c2)$$
$$(-d2 + d3\,(2\,c3\,d2 + 1) + d4\,(-2\,c4\,(-d2 +$$
$$d3\,(2\,c3\,d2 + 1)) - 2\,c3\,d2 - 1)) +$$
$$(-2\,c5\,(-d2 + d3\,(2\,c3\,d2 + 1) + d4\,(-2\,c4\,(-d2 +$$
$$d3\,(2\,c3\,d2 + 1)) - 2\,c3\,d2 - 1)) +$$
$$2\,c4\,(-d2 + d3\,(2\,c3\,d2 + 1)) + 2\,c3\,d2 + 1)$$
$$(1 - 2\,d2\,c2 + d3\,(-2\,c3\,(1 - 2\,d2\,c2) + 2\,c2) +$$

-continued
$$d4(-2c4(1-2d2c2+d3(-2c3(1-2d2c2)+2c2))+$$
$$2c3(1-2d2c2)-2c2)))c1)$$

And the distance between mirror six and the image surface:

$$d6 := -\frac{1}{4}(-2\,angle\,(1-2d2c2+d3(-2c3(1-2d2c2)+ \tag{66}$$
$$2c2)+d4(-2c4(1-2d2c2+d3(-2c3(1-2d2c2)+$$
$$2c2))+2c3(1-2d2c2)-2c2)^2\,c6\,(-2c5\,(-d2+$$
$$d3(2c3d2+1)+d4(-2c4(-d2+d3(2c3d2+1))-$$
$$2c3d2-1))+2c4(-d2+d3(2c3d2+1))+$$
$$2c3d2+1)+2\,angle\,(1-2d2c2+d3(-2c3(1-$$
$$2d2c2)+2c2)+d4(-2c4(1-2d2c2+d3(-2c3(1-$$
$$2d2c2)+2c2))+2c3(1-2d2c2)-2c2))\,c6\,(-d2+$$
$$d3(2c3d2+1)+d4(-2c4(-d2+d3(2c3d2+1))-$$
$$2c3d2-1))(-2c5(1-2d2c2+d3(-2c3(1-$$
$$2d2c2)+2c2)+d4(-2c4(1-2d2c2+d3(-2c3(1-$$
$$2d2c2)+2c2))+2c3(1-2d2c2)-2c2))+$$
$$2c4(1-2d2c2+d3(-2c3(1-2d2c2)+2c2))-$$
$$2c3(1-2d2c2)+2c2)+angle\,(-2c5(1-2d2c2+$$
$$d3(-2c3(1-2d2c2)+2c2)+d4(-2c4(1-2d2c2+$$
$$d3(-2c3(1-2d2c2)+2c2))+2c3(1-2d2c2)-$$
$$2c2))+2c4(1-2d2c2+d3(-2c3(1-2d2c2)+$$
$$2c2))-2c3(1-2d2c2)+2c2)(1-2d2c2+$$
$$d3(-2c3(1-2d2c2)+2c2)+d4(-2c4(1-2d2c2+$$
$$d3(-2c3(1-2d2c2)+2c2))+2c3(1-2d2c2)-$$
$$2c2))(-2c5(-d2+d3(2c3d2+1)+d4(-2c4(-d2+$$
$$d3(2c3d2+1))-2c3d2-1))+2c4(-d2+d3(2c3d2+$$
$$1))+2c3d2+1)-angle\,(-2c5(1-2d2c2+$$
$$d3(-2c3(1-2d2c2)+2c2))+2c3(1-2d2c2)-$$
$$2c2))+2c4(1-2d2c2+d3(-2c3(1-2d2c2)+2c2))-$$
$$2c3(1-2d2c2)+2c2)^2(-d2+d3(2c3d2+1)+$$
$$d4(-2c4(-d2+d3(2c3d2+1))-2c3d2-1))+$$
$$4(-2c5(1-2d2c2+d3(-2c3(1-2d2c2)+2c2)+$$
$$d4(-2c4(1-2d2c2+d3(-2c3(1-2d2c2)+2c2))+$$
$$2c3(1-2d2c2)-2c2))+2c4(1-2d2c2+$$
$$d3(-2c3(1-2d2c2)+2c2))-2c3(1-2d2c2)+$$
$$2c2)(-d2+d3(2c3d2+1)+d4(-2c4(-d2+$$
$$d3(2c3d2+1))-2c3d2-1))c1\,magn\,yob\,c6-$$
$$4c1(-2c5(-d2+d3(2c3d2+1)+d4(-2c4(-d2+$$
$$d3(2c3d2+1))-2c3d2-1))+2c4(-d2+$$
$$d3(2c3d2+1))+2c3d2+1)(1-2d2c2+$$
$$d3(-2c3(1-2d2c2)+2c2)+d4(-2c4(1-2d2c2+$$
$$d3(-2c3(1-2d2c2)+2c2))+2c3(1-2d2c2)-$$
$$2c2))\,magn\,yob\,c6+4magn^2\,yob\,c6^2\,(1-2d2c2+$$

-continued
$$d3(-2c3(1-2d2c2)+2c2)+d4(-2c4(1-2d2c2+$$
$$d3(-2c3(1-2d2c2)+2c2))+2c3(1-2d2c2)-$$
$$2c2)))/((-(-2c5(1-2d2c2+d3(-2c3(1-2d2c2)+$$
$$2c2)+d4(-2c4(1-2d2c2+d3(-2c3(1-2d2c2)+$$
$$2c2))+2c3(1-2d2c2)-2c2))+2c4(1-2d2c2+$$
$$d3(-2c3(1-2d2c2)+2c2))-2c3(1-2d2c2)+$$
$$2c2)(-d2+d3(2c3d2+1)+d4(-2c4(-d2+$$
$$d3(2c3d2+1))-2c3d2-1))+(-2c5(-d2+$$
$$d3(2c3d2+1)+d4(-2c4(-d2+d3(2c3d2+1))-$$
$$2c3d2-1))+2c4(-d2+d3(2c3d2+1))+$$
$$2c3d2+1)(1-2d2c2+d3(-2c3(1-2d2c2)+$$
$$2c2)+d4(-2c4(1-2d2c2+d3(-2c3(1-2d2c2)+$$
$$2c2))+2c3(1-2d2c2)-2c2)))(1-2d2c2+$$
$$d3(-2c3(1-2d2c2)+2c2)+d4(-2c4(1-2d2c2+$$
$$d3(-2c3(1-2d2c2)+2c2))+2c3(1-2d2c2)-$$
$$2c2))c6^2\,angle)$$

4-Mirror System, Stop on mirror 2

Yet again, we can use these derivations to solve the variables of a four-mirror system with the stop position on mirror two. As usual, the first solve is pupil in infinity or telecentricity in the image. The angle of the ray going through the optical axis in the stop surface should be zero in the image. The matrix from the stop surface to the third mirror generated by multiplication of the appropriate M matrices derived above, is given by:

$$\begin{bmatrix} 1 & d2 \\ -2c3 & -2c3\,d2-1 \end{bmatrix} \tag{67}$$

The matrix from the second mirror surface to the stop surface is given by:

$$\begin{bmatrix} 1 & 0 \\ -2c2 & -1 \end{bmatrix} \tag{68}$$

So as derived above, the distance between mirror 3 and 4, solved in the appropriate matrix and the vector of distances is:

$$d3 := -\frac{1}{2} - 2c4\,d2 + 2c3\,d2 + \frac{1}{c4(2c3\,d2+1)} \tag{69}$$

The distance between mirror one and two was:

$$d1 := -\frac{1}{4} - 2\,magn\,yob\,c4 - \frac{angle(-2c3\,d2-1)}{c1\,magn\,yob\,c4} \tag{70}$$

And the distance between the object and the first mirror:

$$d0 := \frac{1}{2}\frac{-angle(-2c3\,d2-1)-2c1\,yob(-2c3\,d2-1)-2magn\,yob\,c4}{angle\,c1(-2c3\,d2-1)} \quad (71)$$

And the distance between mirror four and the image surface:

$$d4 := -\frac{1}{4}(2\,angle\,c4(-2c3\,d2-1)+4\,angle\,c3\,c4\,d2+ \quad (72)$$
$$2\,angle\,c3\,(-2c3\,d2-1)+2\,angle(-2c3\,d2-1)^2c2+$$
$$4c1(-2c3\,d2-1)\,magn\,yob\,c4+4\,magn^2\,yob\,c4^2)/$$
$$(c4^2\,angle)$$

4-Mirror System, Stop on Mirror 3

Again, we use the original derivations to solve the variables of a four-mirror system with the stop position on mirror three. The first solve is pupil in infinity or telecentricity in the image. The angle of the ray going through the optical axis in the stop surface should be zero in the image. The matrix from the stop surface to the third mirror generated by multiplication of the appropriate M matrices derived above is given by:

$$\begin{bmatrix} 1 & 0 \\ 0 & 1 \end{bmatrix} \quad (73)$$

The matrix from the second mirror surface to the stop surface is given by:

$$\begin{bmatrix} 1-2d2\,c2 & -d2 \\ -2c3(1-2d2\,c2)+2c2 & 2c3\,d2+1 \end{bmatrix} \quad (74)$$

So as we derived the distance between mirror 3 and 4 is:

$$d3 := -\frac{1}{2}\frac{1}{c4} \quad (75)$$

And we solve this new found value in the appropriate matrix and the vector of distances. The distance between mirror one and two was:

$$d1 := -\frac{1}{4}\frac{-4d2\,c1\,magn\,yob\,c4-2(1-2d2\,c2)\,magn\,yob\,c4+}{(1-2d2\,c2)\,angle(2c3\,d2+1)+} \quad (76)$$
$$\frac{angle\,d2(-2c3(1-2d2\,c2)+2c2)}{(1-2d2\,c2)c1\,magn\,yob\,c4}$$

And the distance between the object and the first mirror:

$$d0 := -\frac{1}{2}((1-2d2\,c2)\,angle(2c3\,d2+1)+ \quad (77)$$
$$angle\,d2(-2c3(1-2d2\,c2)+2c2)+2c1\,yob\,d2$$
$$(-2c3(1-2d2\,c2)+2c2)+2c1\,yob(1-2d2\,c2)$$
$$(2c3\,d2+1)-2(1-2d2\,c2)\,magn\,yob\,c4)/$$
$$(angle((-2c3(1-2d2\,c2)+2c2)d2+$$
$$(2c3\,d2+1)(1-2d2\,c2))c1)$$

And the distance between mirror four and the image surface:

$$d4 := -\frac{1}{4}(-2\,angle(1-2d2\,c2)^2c4(2c3\,d2+1)- \quad (78)$$
$$2\,angle(1-2d2\,c2)c4\,d2(-2c3(1-2d2\,c2)+2c2)+$$
$$angle(-2c3(1-2d2\,c2)+2c2)(1-2d2\,c2)(2c3\,d2+1)+$$
$$angle(-2c3(1-2d2\,c2)+2c2)^2d2-$$
$$4(-2c3(1-2d2\,c2)+2c2)d2\,c1\,magn\,yob\,c4-$$
$$4c1(2c3\,d2+1)(1-2d2\,c2)\,magn\,yob\,c4+$$
$$4\,magn^2\,yob\,c4^2(1-2d2\,c2))/$$
$$(((-2c3(1-2d2\,c2)+2c2)d2+(2c3\,d2+1)(1-2d2\,c2))$$
$$(1-2d2\,c2)c4^2\,angle)$$

Obscuration

Figure 4:
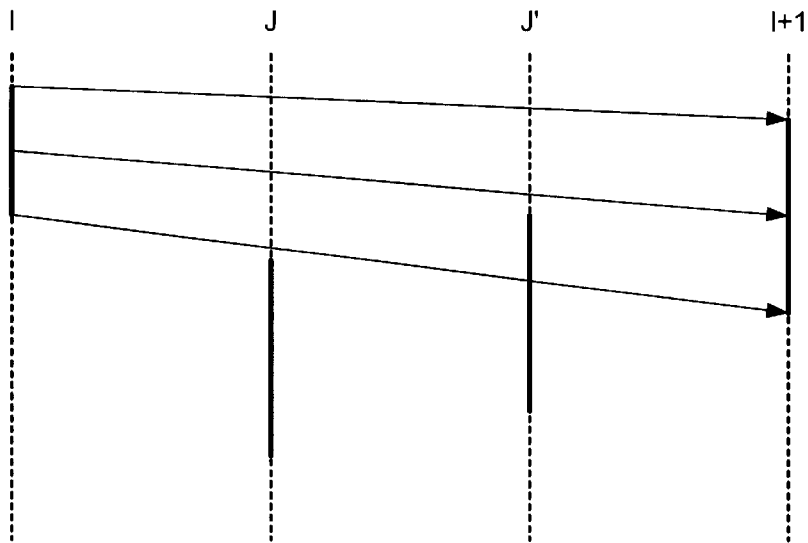
FIG. 4 is a diagram used in explaining how beam obstruction in a mirror design is determined.

A particular problem in designing mirror systems, not encountered in refractive lens systems, is ensuring that the beam is not obscured in its zigzag course by other mirrors. Because of the necessary zigzag path, as the projection beam proceeds between successive mirrors I and I+1 on the optical path in many cases it will pass by at least one other mirror J. Thus, for an optical system not to be obscured it is necessary to ensure that the position and extent of the intervening mirror J is such that it does not intersect any part of the beam between mirrors I and I+1. This is shown in FIG. 4 in which it can be seen that mirror lies wholly below the beam between I and I+1 whereas mirror J' partially intersects the beam. The arrangement of mirror is not permitted.

In a model of a potential projection system, obscuration can be detected by the following procedure:

1. For each pair of successive mirrors I, I+1 on the optical path, check if there exists a 20 mirror J (with J not equal to I, I+1) having a position on the optical axis (Z axis) between I and I+1
2. If J exists, calculate the distance from the optical axis (Y position) of the extreme rays from I to I+1 at the position of mirror j on the optical axis.
3. Check that the top and bottom of mirror J are both above (i.e. have greater Y position) or both below (i.e. have smaller Y position) both the extreme rays from I to I+1. If the check in (3) fails, then mirror at least partially obscures the beam from I to I+1 and the mirror system must be modified or rejected.

Preferred Four-mirror Systems

Figure 6:
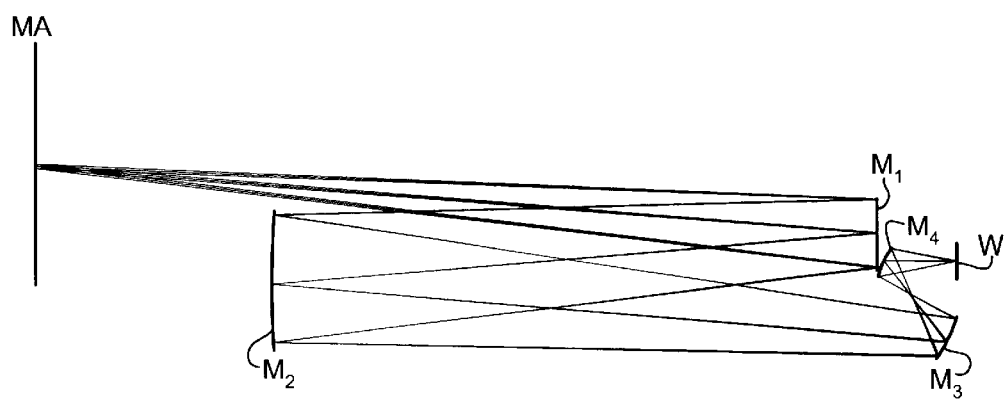
FIGS. 6 to 19 are diagrams of mirror systems according to various embodiments of the invention.

FIG. 6 shows a mirror system in class 9(+) which can be used in the lithography apparatus of FIG. 1. In this class, the stop can be positioned on mirror 2 or 3; in the system of FIG. 6, the stop position is on surface 2. The ring field of this system is defined on the object side, between 114 and 118 arbitrary units, with a numerical aperture of 0.25 (0.05 on the object side). The magnification is 0.2 and an intermediate image is formed between mirrors 3 and 4. The first order curvatures and thicknesses of this system, in arbitrary units, are given in Table 1 below. The values found for the curvatures and thicknesses can be re-scaled using a scaling factor. If the thicknesses are multiplied by that factor, the curvatures should be divided by it, and vice versa.

Figure 7:
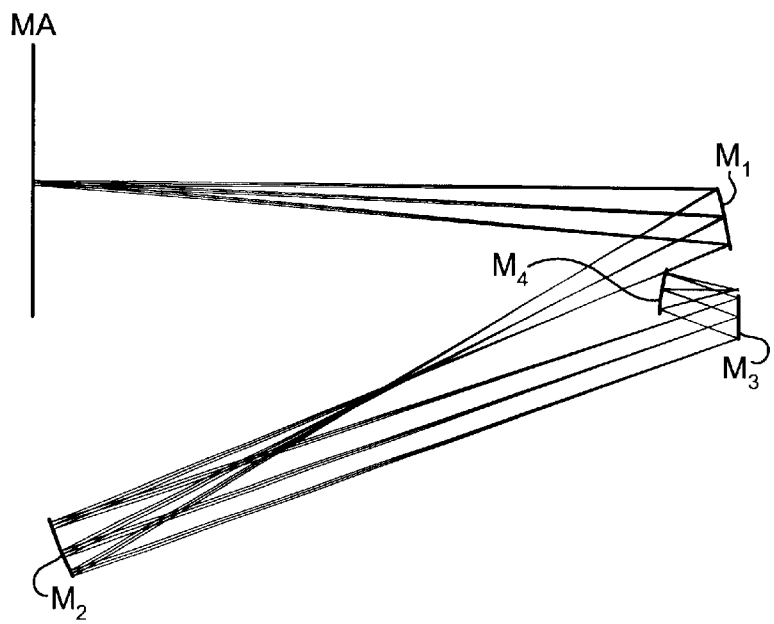

FIG. 7 also shows a mirror system in class 9(+). In this case the stop is on mirror 3 and the intermediate image is between mirrors 1 and 2. The first order curvatures and thicknesses of this system, in arbitrary units, are given in Table 2 below.

Figure 8:
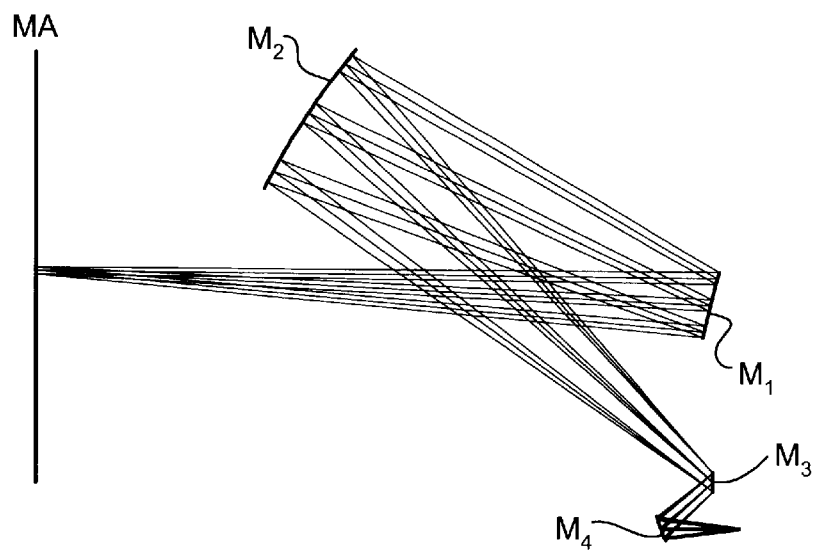

FIG. 8 shows an example of a class 2(−) system having the stop located on the third mirror. From the object (mask MA, surface 0) all the rays go, with a negative angle (a zero angle is parallel to the optical axis), to the first convex mirror $M_1$. The convex mirror $M_1$ reflects the beam upward to a large concave mirror $M_2$. The position of the second mirror $M_2$ has to be above the beam between the object (mask MA) and mirror $M_1$. The beam then goes under mirror $M_1$ to the stop surface mirror $M_3$. From the stop surface the beam is reflected to concave mirror $M_4$. Mirror $M_4$ takes care of a telecentric illumination of the image (surface 5). The first order curvatures and thicknesses of this system, in arbitrary units, are given in Table 3 below.

Figure 9:
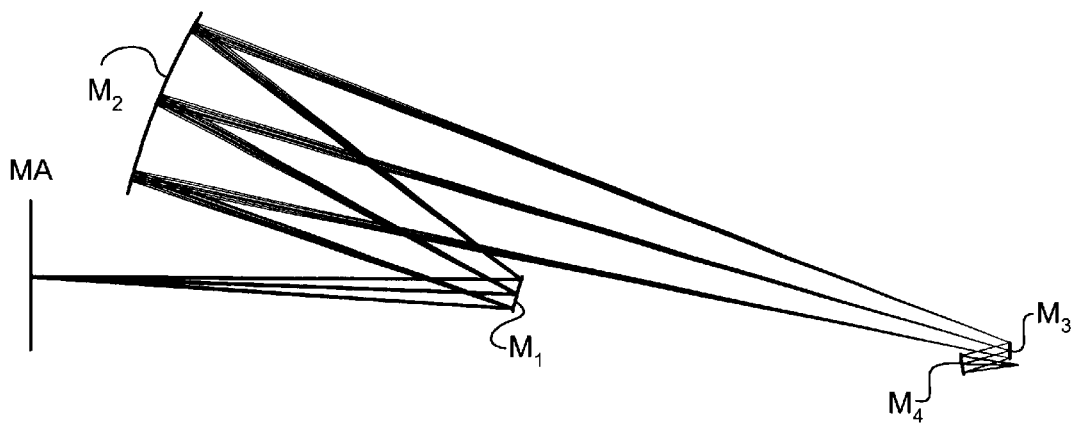

A class 6(−) system, shown in FIG. 9, consists of two mirror pairs, in a symmetrical design. From the object (mask MA, surface 0) all the rays go, with a negative angle (a zero angle is parallel to the optical axis), to the first convex mirror $M_1$. The object is illuminated as telecentric as possible, this being a requirement for lithography. The convex mirror $M_1$ reflects the beam upward to a large concave mirror $M_2$. The position of this mirror has to be above the beam between the object and mirror $M_1$. So far this design resembles the class 2(−) design (shown in FIG. 8). The beam then goes over mirror $M_1$ to the stop surface on mirror $M_3$, limited by the top of mirror $M_1$. From the stop surface $M_3$ the beam is reflected to concave mirror $M_4$. Mirror $M_4$ takes care of a telecentric illumination of the image (surface 5). The ring field of this system is defined on the image side, between −22.8 and −23.8, resulting in a Strehl ratio of at least 0.972 with a numerical aperture of 0.15. The first order curvatures and thicknesses of this system, in arbitrary units, are given in Table 4 below.

Figure 10:
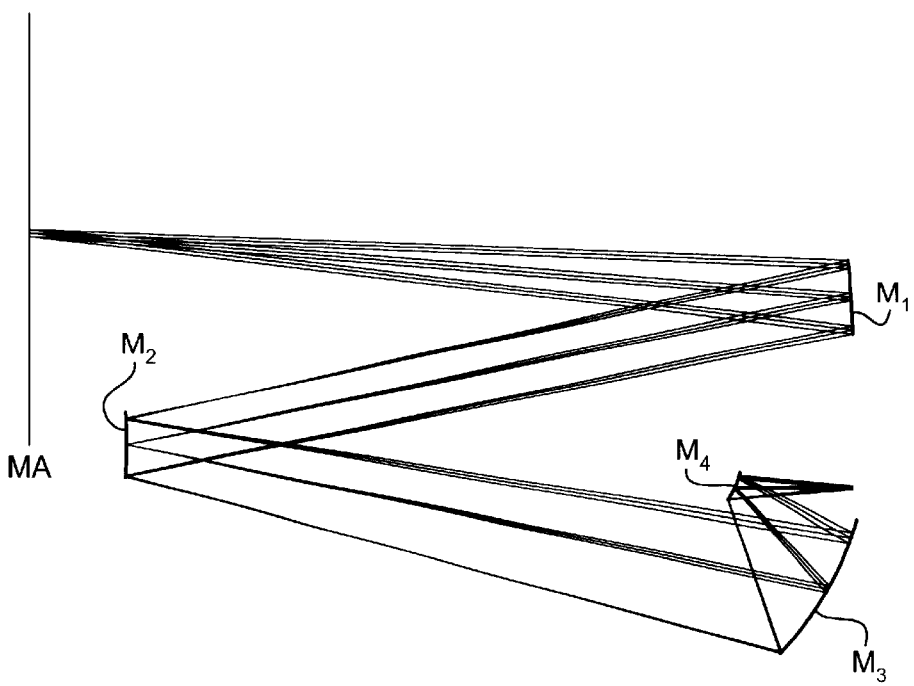

A class 9(−) system with a stop on the second surface is shown in FIG. 10. The ring field of this system is defined on the object side, between 114 and 118 arbitrary units, with a numerical aperture of 0.2 (0.05 on the object side). The first order curvatures and thicknesses of this system, in arbitrary units, are given in Table 5 below.

Figure 11:
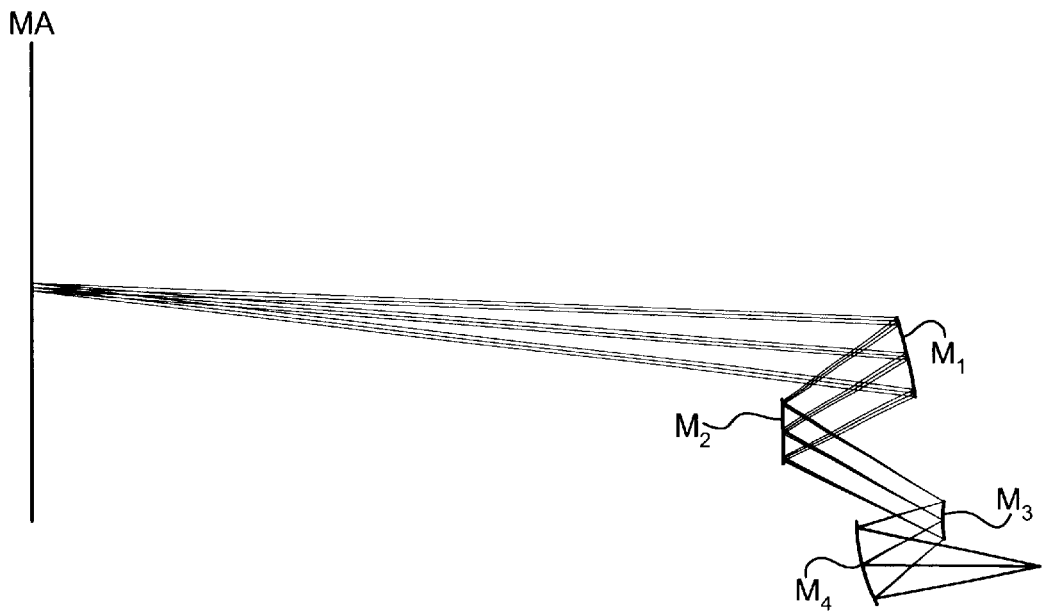

FIG. 11 shows a system in class 10(−). The ring field of this system is defined on the object side, between 114 and 118 arbitrary units, with a numerical aperture of 0.2 (0.05 on the object side). The first order curvatures and thicknesses of this system, in arbitrary units, are given in Table 6 below.

Preferred Six-mirror Systems

All the six-mirror systems found to be feasible have, as they have a positive magnification, an intermediate image.

Figure 12:
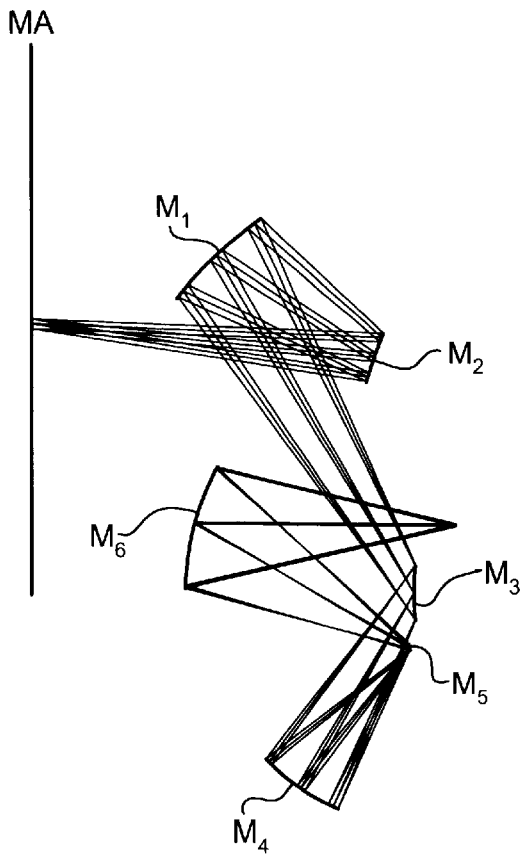

FIG. 12 shows a six-mirror system in class 9(+) in which the stop can be positioned on mirror 2, 3, 4 and 5. The system has the intermediate image located between mirror 2 and five. The ring field of this system is defined on the object side, between 114 and 118 arbitrary units, with a numerical aperture of 0.24 (0.06 on the object side). The first order curvatures and thicknesses of this system, in arbitrary units, are given in Table 7 below.

A class 37(+) six-mirror system can have the stop positioned on mirror 2, 3, 4 or 5 and has the intermediate image located between mirror 2 and five. The ring field of such a system is defined on the image side, between 27 and 30 arbitrary units, with a numerical aperture of 0.24.

Figure 13:
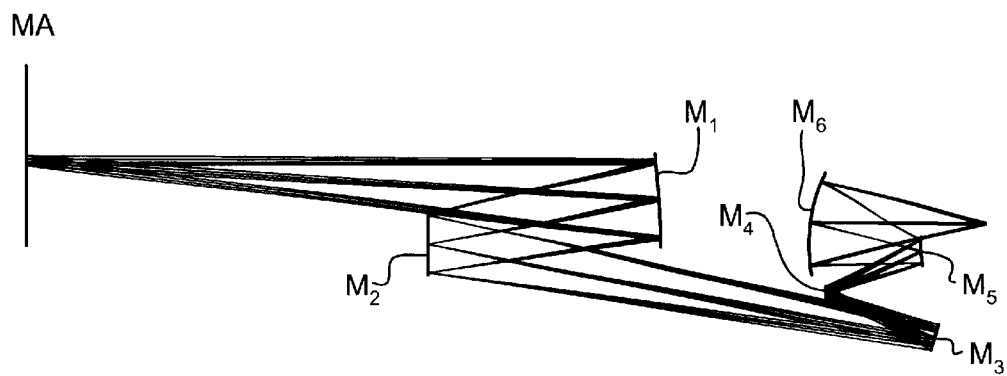

The system shown in FIG. 13 has the stop on surface 2. This system consists of a mirror pair near the object and four-mirrors grouped near the image. From the object (mask MA, surface 0) all the rays go, with a negative angle, to the first concave mirror $M_1$. The concave mirror $M_1$ reflects the beam downward to mirror M2 which is almost flat. The top of mirror $M_2$ is restricted to be below the beam between the object and mirror $M_,$. The beam between mirror $M_2$ and $M_3$ limits the bottom of the small mirror $M_4$, while the beam between mirror $M_4$ and $M_5$ limits the top of mirror $M_4$. Finally, the beam between the last mirror $M_6$ and the image limits the top of mirror $M_5$. The first order curvatures and thicknesses of this system, in arbitrary units, are given in Table 8 below.

Figure 14:
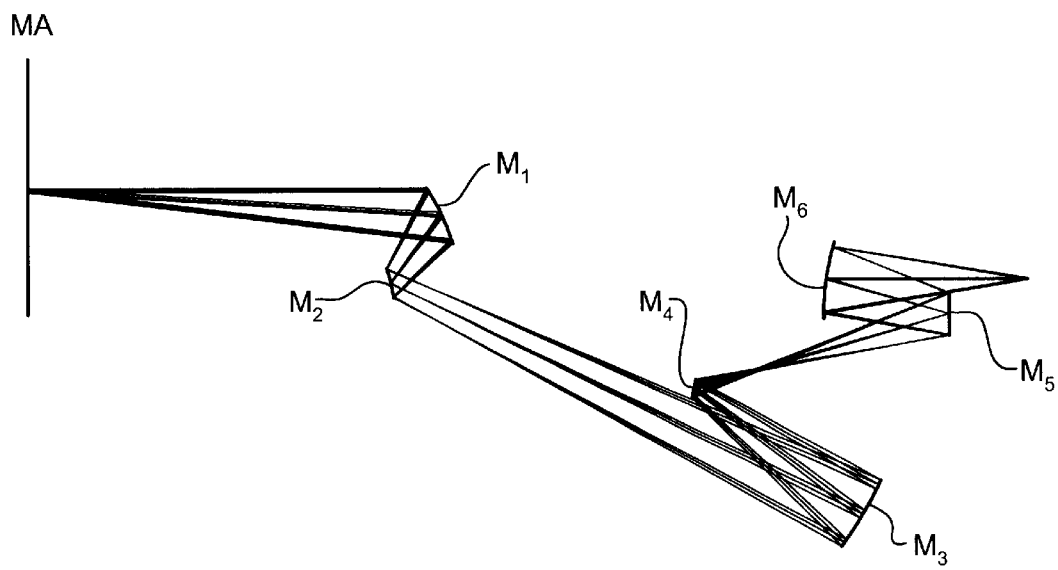

For comparison, FIG. 14 shows a class 37(+) six-mirror system with the stop on surface 5. The ring field of this system is defined on the image side, between 27 and 30 arbitrary units, with a numerical aperture of 0.24. The first order curvatures and thicknesses of this system, in arbitrary units, are given in Table 9 below.

Preferred Eight-mirror System

Figure 15:
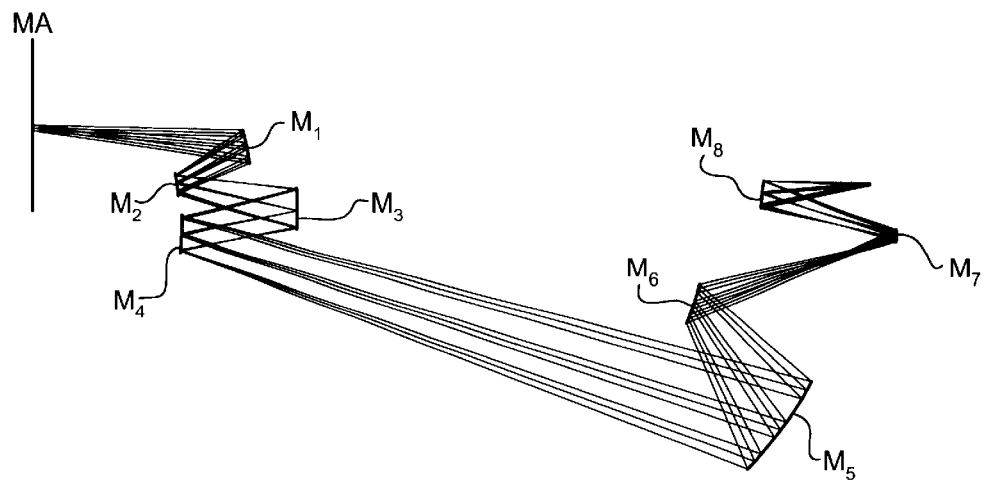

An eight-mirror system in class 165(+) with stop on surface 3 is shown in FIG. 15. The ring field of this system is defined on the object side, between 116 and 124 arbitrary units, with a numerical aperture of 0.24 (0.06 on the object side). The first order curvatures and thicknesses of this system, in arbitrary units, are given in Table 10 below.

Figure 16:
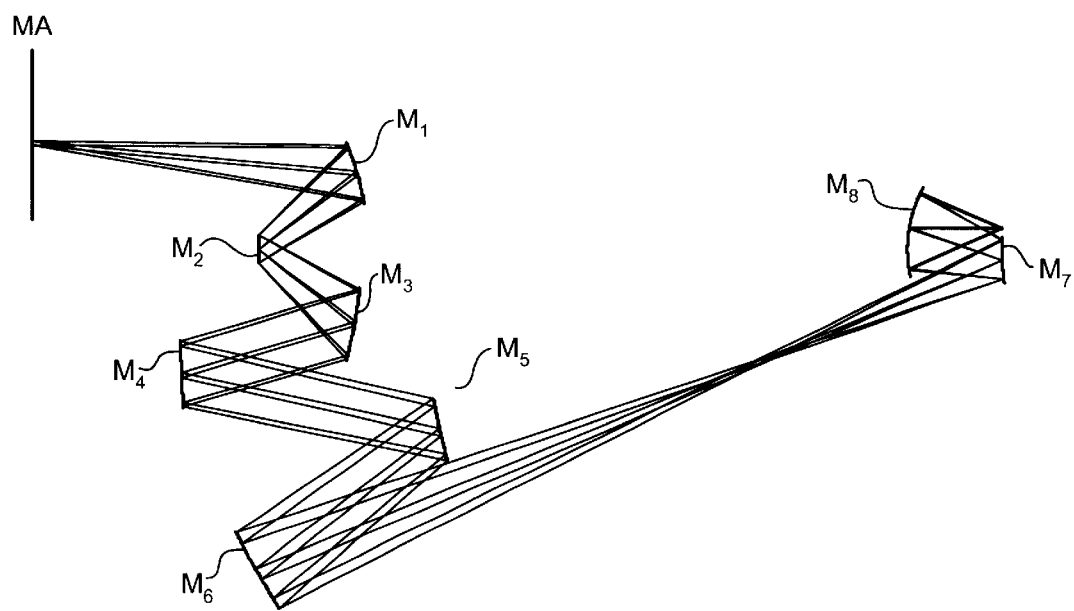

An eight mirror system in class 169(+) is shown in FIG. 16, the curvatures and thicknesses of its elements are shown in Table 11. This system has a ring field in the object side between 114 and 118 arbitrary units, a numerical aperture of 0.4, distortion <2.9 nm and an rms wavefront error <0.3$\lambda$.

Figure 17:
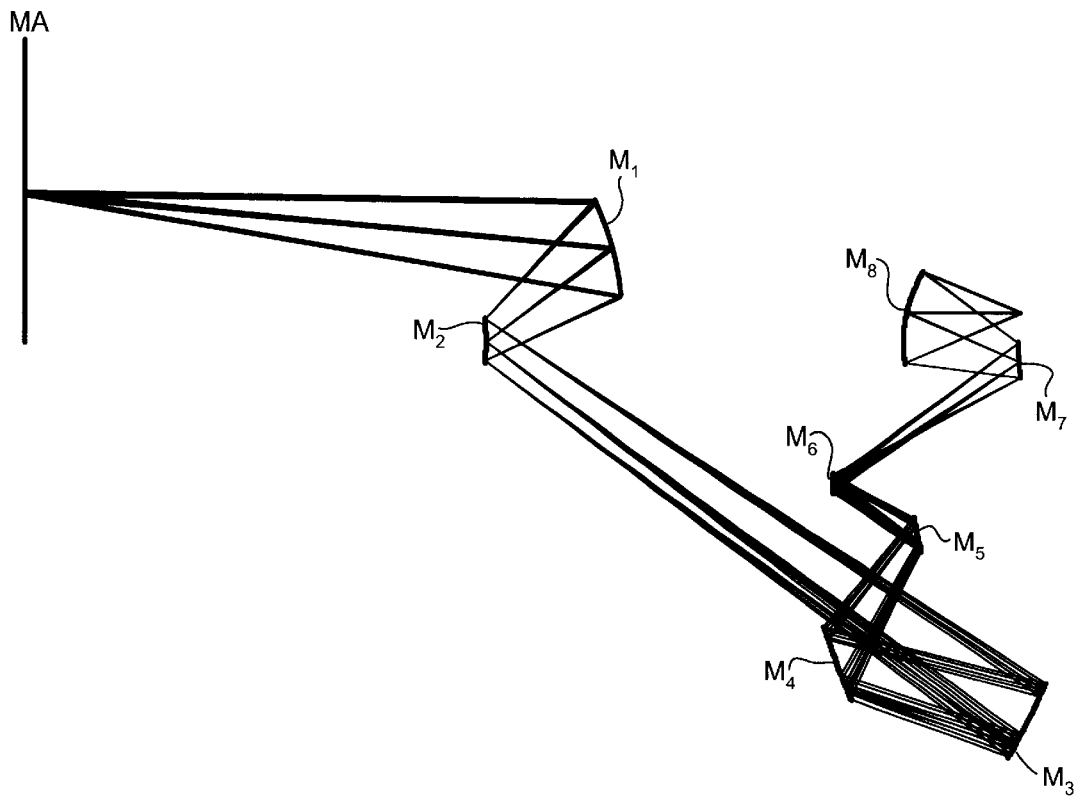

An eight mirror system in class 181(+) is shown in FIG. 17, the curvatures and thicknesses of its elements are shown in Table 12. Again, the ring field on the object side is between 114 and 118 units and the numerical aperture is 0.4. However, the distortion is <1.9 nm and the rms wavefront error <0.5$\lambda$.

Figure 18:
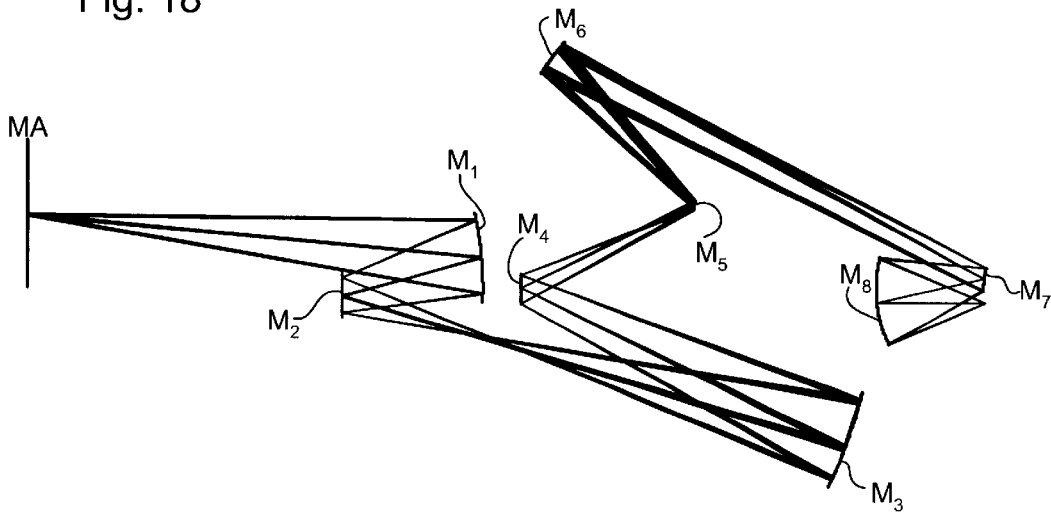

An eight mirror system in class 150(−) is shown in FIG. 18, the curvatures and thicknesses of its elements are shown in Table 13. This system provides a distortion <2.6 nm and an rms wavefront error <0.19$\lambda$.

Figure 19:
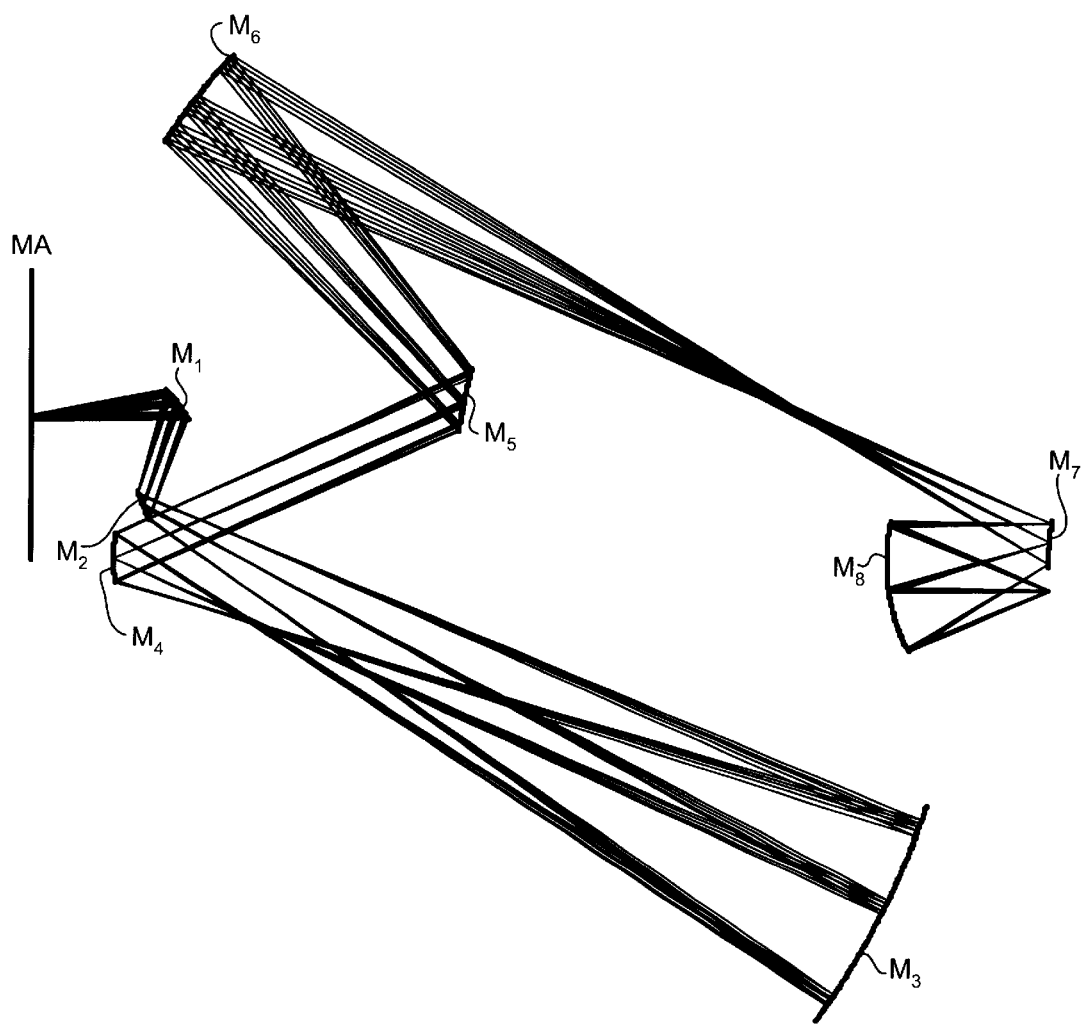

An eight mirror system in class 182(−) is shown in FIG. 19, the curvatures and thicknesses of its elements are shown in Table 14. This system likewise has a ring field on the object side between 114 and 118 arbitrary units, a numerical aperture of 0.4, an rms wavefront error of <1$\lambda$ and a distortion <2.18 nm.

While we have described above specific embodiments of the invention it will be appreciated that the invention may be practiced otherwise than described. The description is not intended to limit the invention.

TABLE 1

| | Curvature | | Thickness |
|---|---|---|---|
| | | $d_0$ | 834.233264 |
| $c_1$ | −0.00014266 | $d_1$ | −599.763693 |
| $c_2$ | 0.00088498 | $d_2$ | 684.179623 |
| $c_3$ | −0.00998244 | $d_3$ | −83.415929 |
| $c_4$ | 0.01918223 | $d_4$ | 61.797248 |
| | | $d_5$ | 16.018048 |

TABLE 2

| | Curvature | | Thickness |
|---|---|---|---|
| | | $d_0$ | 616.993869 |
| $c_1$ | −0.00243396 | $d_1$ | −633.892913 |
| $c_2$ | 0.00190431 | $d_2$ | 636.600251 |
| $c_3$ | 0.00025705 | $d_3$ | −69.291720 |
| $c_4$ | 0.00724502 | $d_4$ | 64.788741 |
| | | $d_5$ | 4.467388 |

TABLE 3

| | Curvature | | Thickness |
|---|---|---|---|
| | | $d_0$ | 359.659357 |
| $c_1$ | 0.00152836 | $d_1$ | −274.181525 |
| $c_2$ | 0.00259323 | $d_2$ | 261.925120 |
| $c_3$ | 0.01867917 | $d_3$ | −26.735917 |
| $c_4$ | 0.01765947 | $d_4$ | 48.776080 |
| | | $d_5$ | −0.416277 |

TABLE 4

| | Curvature | | Thickness |
|---|---|---|---|
| | | $d_0$ | 767.692000 |
| $c_1$ | 0.00300902 | $d_1$ | −642.472629 |
| $c_2$ | 0.00095506 | $d_2$ | 1445.239615 |
| $c_3$ | 0.00407728 | $d_3$ | −78.092188 |
| $c_4$ | 0.00607760 | $d_4$ | 94.620253 |
| | | $d_5$ | −1.961967 |

TABLE 5

| | Curvature | | Thickness |
|---|---|---|---|
| | | $d_0$ | 449.444384 |
| $c_1$ | −0.00042724 | $d_1$ | −396.786263 |
| $c_2$ | −0.00168067 | $d_2$ | 403.457960 |
| $c_3$ | −0.00659922 | $d_3$ | −67.000191 |
| $c_4$ | −0.01721598 | $d_4$ | 54.629940 |
| | | $d_5$ | 4.695013 |

TABLE 6

| | Curvature | | Thickness |
|---|---|---|---|
| | | $d_0$ | 444.844414 |
| $c_1$ | −0.00256672 | $d_1$ | −83.893940 |
| $c_2$ | −0.00023614 | $d_2$ | 80.638988 |
| $c_3$ | 0.01329749 | $d_3$ | −42.956528 |
| $c_4$ | 0.01099286 | $d_4$ | 93.755560 |
| | | $d_5$ | −0.762586 |

TABLE 7

| | Curvature | | Thickness |
|---|---|---|---|
| | | $d_0$ | 131.380868 |
| $c_1$ | 0.00289128 | $d_1$ | −113.331683 |
| $c_2$ | 0.00499283 | $d_2$ | 146.579813 |
| $c_3$ | 0.00863830 | $d_3$ | −93.218415 |
| $c_4$ | 0.01007555 | $d_4$ | 88.970994 |
| $c_5$ | 0.01220780 | $d_5$ | −93.941281 |
| $c_6$ | 0.00873868 | $d_6$ | 116.487572 |
| | | $d_7$ | −0.127679 |

TABLE 8

| | Curvature | | Thickness |
|---|---|---|---|
| | | $d_0$ | 828.570000 |
| $c_1$ | −0.00111627 | $d_1$ | −304.777604 |
| $c_2$ | −0.00007435 | $d_2$ | 680.858425 |
| $c_3$ | −0.00238747 | $d_3$ | −160.275601 |
| $c_4$ | −0.00019501 | $d_4$ | 124.017066 |

TABLE 8-continued

| | Curvature | | Thickness |
|---|---|---|---|
| $c_5$ | 0.00719636 | $d_5$ | −145.964808 |
| $c_6$ | 0.00467166 | $d_6$ | 231.541247 |
| | | $d_7$ | 0.075648 |

TABLE 9

| | Curvature | | Thickness |
|---|---|---|---|
| | | $d_0$ | 405.798032 |
| $c_1$ | −0.00475154 | $d_1$ | −64.654405 |
| $c_2$ | −0.00852932 | $d_2$ | 487.659410 |
| $c_3$ | −0.00286217 | $d_3$ | −202.163489 |
| $c_4$ | −0.00307574 | $d_4$ | 230.915333 |
| $c_5$ | 0.00000503 | $d_5$ | −116.766023 |
| $c_6$ | 0.00422514 | $d_6$ | 189.881646 |
| | | $d_7$ | 0.000000 |

TABLE 10

| | Curvature | | Thickness |
|---|---|---|---|
| | | $d_0$ | 322.380000 |
| $c_1$ | −0.00178490 | $d_1$ | −108.516829 |
| $c_2$ | −0.00245113 | $d_2$ | 174.110025 |
| $c_3$ | −0.00202694 | $d_3$ | 168.774787 |
| $c_4$ | −0.00124407 | $d_4$ | 983.268141 |
| $c_5$ | −0.00183868 | $d_5$ | −213.604816 |
| $c_6$ | −0.00200081 | $d_6$ | 274.820705 |
| $c_7$ | 0.00126629 | $d_7$ | −197.754689 |
| $c_8$ | 0.00476144 | $d_8$ | 160.164412 |
| | | $d_9$ | 0.000000 |

TABLE 11

| | Curvature | | Thickness |
|---|---|---|---|
| | | $d_0$ | 420.601299 |
| $c_1$ | −0.00323603 | $d_1$ | −125.470789 |
| $c_2$ | −0.00902233 | $d_2$ | 110.112590 |
| $c_3$ | −0.00206939 | $d_3$ | −160.044449 |
| $c_4$ | 0.00036641 | $d_4$ | 258.697858 |
| $c_5$ | 0.00126054 | $d_5$ | −279.043974 |
| $c_6$ | 0.00146300 | $d_6$ | 905.704090 |
| $c_7$ | 0.00275699 | $d_7$ | −111.254872 |
| $c_8$ | 0.00673385 | $d_8$ | 112.775777 |
| | | $d_9$ | 0 |

TABLE 12

| | Curvature | | Thickness |
|---|---|---|---|
| | | $d_0$ | 455.886404 |
| $c_1$ | −0.00355263 | $d_1$ | −116.531978 |
| $c_2$ | −0.00563559 | $d_2$ | 515.664329 |
| $c_3$ | −0.00151867 | $d_3$ | −282.841809 |
| $c_4$ | 0.00151480 | $d_4$ | 89.911348 |
| $c_5$ | 0.00127162 | $d_5$ | −49.006196 |
| $c_6$ | −0.00070814 | $d_6$ | 152.535737 |
| $c_7$ | 0.00667355 | $d_7$ | −82.044394 |
| $c_8$ | 0.00867329 | $d_8$ | 98.259942 |
| | | $d_9$ | 0.267746 |

TABLE 13

| | Curvature | | Thickness |
|---|---|---|---|
| | | $d_0$ | 713.868812 |
| $c_1$ | −0.00187689 | $d_1$ | −225.978195 |
| $c_2$ | −0.00045910 | $d_2$ | 871.620787 |
| $c_3$ | −0.00138063 | $d_3$ | −601.119900 |
| $c_4$ | −0.00002434 | $d_4$ | 269.267756 |
| $c_5$ | 0.00166695 | $d_5$ | −342.201234 |
| $c_6$ | 0.00162141 | $d_6$ | 807.574290 |
| $c_7$ | 0.00773514 | $d_7$ | −167.796714 |
| $c_8$ | 0.00506893 | $d_8$ | 169.913678 |
| | | $d_9$ | 0 |

TABLE 14

| | Curvature | | Thickness |
|---|---|---|---|
| | | $d_0$ | 84.702306 |
| $c_1$ | −0.00487728 | $d_1$ | −49.028673 |
| $c_2$ | −0.01142777 | $d_2$ | 677.956498 |
| $c_3$ | −0.00154677 | $d_3$ | −710.120744 |
| $c_4$ | 0.00369184 | $d_4$ | 305.647599 |
| $c_5$ | 0.00218954 | $d_5$ | −323.556990 |
| $c_6$ | 0.00163258 | $d_6$ | 878.491460 |
| $c_7$ | 0.00460099 | $d_7$ | −136.990287 |
| $c_8$ | 0.00616448 | $d_8$ | 137.341290 |
| | | $d_9$ | 0 |

What is claimed is:

1. A lithographic projection apparatus comprising:
a radiation system to provide a projection beam of radiation;
a support structure adapted to support patterning structure which can be used to pattern the projection beam according to a desired pattern;
a substrate table to hold a substrate;
a projection system to project the patterned beam onto a target portion of the substrate,
wherein said projection system includes precisely four imaging mirrors in the optical path of the projection beam and has an incidence angle classification, C, of 2(−), 6(−), or 9(−), where:

$$C = \sum_{i=1}^{4} a_i \cdot 2^{(4-i)} \left(\frac{M}{|M|}\right)$$

$a_i=1$ if an angle of incidence of a chief ray at mirror i is negative,
$a_i=0$ if the angle of incidence of the chief ray at mirror i is positive,
M is a magnification of the projection system, and
the index i numbers the mirrors from object to image.

2. Apparatus according to claim 1 wherein said projection system has a stop on one of a second mirror of the four imaging mirrors and a third mirror of the four imaging mirrors.

3. Apparatus according to claim 1 wherein said projection system has an intermediate image located at one of between first and second ones of the mirrors, between second and third ones of the mirrors and between third and fourth ones of the mirrors.

4. A lithographic projection apparatus comprising:
a radiation system to provide a projection beam of radiation;
a support structure adapted to support patterning structure which can be used to pattern the projection beam according to a desired pattern;
a substrate table to hold a substrate;
a projection system to project the patterned beam onto a target portion of the substrate,
wherein said projection system has precisely six imaging mirrors in the optical path of the projection beam and has an incidence angle classification, C, of 5(+), 6(−), 9(+), 13(+), 18(−), 21(+), 22(−), 25(+), 29(+), 34(−), 37(+), 38(−), 42(−), or 54(−), where:

$$C = \sum_{i=1}^{6} a_i \cdot 2^{(6-i)} \left(\frac{M}{|M|}\right)$$

$a_i=1$ if an angle of incidence of a chief ray at mirror i is negative,
$a_i=0$ if the angle of incidence of the chief ray at mirror i is positive,
M is a magnification of the projection system, and
the index i numbers the mirrors from object to image.

5. Apparatus according to claim 4, wherein said projection system has a stop located on one of second, third, fourth and fifth ones of the mirrors.

6. Apparatus according to claim 4, wherein said projection system has an intermediate image between the second and fifth mirror.

7. Apparatus according to claim 4 wherein said projection system has the smallest deviation from telecentricity while still enabling obscuration-free illumination of the mask such that, for each point on the object, in a pencil of rays leaving an object, a ray forming the smallest angle with an optical axis forms an angle not larger than 10° to the optical axis.

8. Apparatus according to claim 4 wherein said projection is substantially telecentric on the image side such that for each point on an object, the ray passing through the center of the aperture stop forms in an image space an angle with an optical axis not larger than 1°.

9. Apparatus according to claim 4 wherein each mirror in said projection system is substantially rotationally symmetric about an optical axis.

10. Apparatus according to claim 4 wherein said projection system has a magnification whose absolute value is in the range of from ⅓ to ¹/₁₀.

11. Apparatus according to claim 10 wherein said magnification has an absolute value substantially equal to one of ¼ and ⅕.

12. Apparatus according to claim 4 wherein said projection beam comprises extreme ultraviolet radiation having a wavelength in the range of from 8 to 20 nm.

13. Apparatus according to claim 12 wherein said projection beam comprises extreme ultraviolet radiation having a wavelength in the range of from 9 to 16 nm.

14. An apparatus according to any claim 4, wherein the support structure comprises a mask table for holding a mask.

15. An apparatus according to claim 4, wherein the radiation system comprises a radiation source.

16. A device manufacturing method comprising:
projecting the patterned beam onto a target portion of the substrate, wherein said projection system has precisely six imaging mirrors in the optical path of the projection beam and has an incidence angle classification, C, of 5(+), 6(−), 9(+), 13(+), 18(−), 21(+), 22(−), 25(+), 29(+), 34(−), 37(+), 38(−), 42(−), or 54(−), where:

$$C = \sum_{i=1}^{6} a_i \cdot 2^{(6-i)} \left( \frac{M}{|M|} \right)$$

$a_i$=1 if an angle of incidence of a chief ray at mirror i is negative,
$a_i$=0 if the angle of incidence of the chief ray at mirror i is positive,
M is a magnification of the projection system, and
the index i numbers the mirrors from object to image.

17. A lithographic projection apparatus comprising:
a radiation system to provide a projection beam of radiation;
a support structure adapted to support patterning structure which can be used to pattern the projection beam according to a desired pattern;
a substrate table to hold a substrate;
a projection system to project the patterned beam onto a target portion of the substrate,
wherein said projection system has precisely eight imaging mirrors in the optical path of the projection beam and has an incidence angle classification, C, of 2(+), 5(+), 9(+), 12(+), 13(+), 18(+), 18(−), 19(+), 20(+), 21(+), 22(+), 23(+), 25(+), 26(+), 34(−), 36(+), 37(+), 38(−), 45(+), 46(+), 49(+), 52(+), 53(+), 54(+), 54(−), 55(−), 59(−), 68(+), 69(+), 73(+), 74(+), 77(+), 82(+), 82(−), 85(+), 88(+), 89(+), 90(−), 92(+), 93(+), 97(+), 100(−), 101(+), 102(−), 104(+), 105(+), 106(+), 106(−), 107(+), 108(+), 109(+), 109(−), 110(+), 110(−), 111(+), 113(+), 116(+), 117(+), 118(+), 118(−), 120(+), 121(+), 122(−), 123(−), 132(+), 133(+), 134(−), 137(+), 138(+), 141(+), 145(+), 145(−), 146(+), 146(−), 147(+), 148(+), 148(−), 149(+), 150(+), 150(−), 151(+), 151(−), 152(−), 153(+), 154(+), 154(−), 155(+), 155(−), 156(+), 157(+), 159(+), 161(+), 162(−), 163(−), 164(+), 165(+), 166(+), 166(−), 167(+), 168(+), 169(+), 170(+), 170(−), 171(+), 172(+), 173(+), 174(+), 175(+), 176(+), 177(+), 178(−), 179(+), 180(+), 180(−), 181(+), 181(−), 182(+), 182(−), 183(+), 183(−), 184(+), 185(+), 185(−), 186(−), 187(+), 187(−), 188(−), 189(+), 196(+), 197(+), 201(+), 203(+), 205(+), 209(+), 214(−), 216(+), 217(+), 218(+), 218(−), 225(+), 228(+), 229(+), 230(+), 232(+), 233(+), 235(+), 236(+), 237(+), 238(−), 243(+), 246(+), 247(+), 248(+), 250(−), where:

$$C = \sum_{i=1}^{8} a_i \cdot 2^{(8-i)} \left( \frac{M}{|M|} \right)$$

$a_i$=1 if an angle of incidence of a chief ray at mirror i is negative,
$a_i$=0 if the angle of incidence of the chief ray at mirror i is positive,
M is a magnification of the projection system, and
the index i numbers the mirrors from object to image.

18. Apparatus according to claim 1 wherein said projection system has the smallest deviation from telecentricity while still enabling obscuration-free illumination of the mask such that, for each point on the object, in a pencil of rays leaving an object, a ray forming the smallest angle with an optical axis forms an angle not larger than 10° to the optical axis.

19. Apparatus according to claim 1 wherein said projection is substantially telecentric on the image side such that for each point on an object, the ray passing through the center of the aperture stop forms in an image space an angle with an optical axis not larger than 1°.

20. Apparatus according to claim 1 wherein each mirror in said projection system is substantially rotationally symmetric about an optical axis.

21. Apparatus according to claim 1 wherein said projection system has a magnification whose absolute value is in the range of from 1/3 to 1/10.

22. Apparatus according to claim 21 wherein said magnification has an absolute value substantially equal to one of 1/4 and 1/5.

23. Apparatus according to claim 1 wherein said projection beam comprises extreme ultraviolet radiation having a wavelength in the range of from 8 to 20 nm.

24. Apparatus according to claim 23 wherein said projection beam comprises extreme ultraviolet radiation having a wavelength in the range of from 9 to 16 nm.

25. An apparatus according to any claim 1, wherein the support structure comprises a mask table for holding a mask.

26. An apparatus according to claim 1, wherein the radiation system comprises a radiation source.

27. Apparatus according to claim 17 wherein said projection system has the smallest deviation from telecentricity while still enabling obscuration-free illumination of the mask such that, for each point on the object, in a pencil of rays leaving an object, a ray forming the smallest angle with an optical axis forms an angle not larger than 10° to the optical axis.

28. Apparatus according to claim 17 wherein said projection is substantially telecentric on the image side such that for each point on an object, the ray passing through the center of the aperture stop forms in an image space an angle with an optical axis not larger than 1°.

29. Apparatus according to claim 17 wherein each mirror in said projection system is substantially rotationally symmetric about an optical axis.

30. Apparatus according to claim 17 wherein said projection system has a magnification whose absolute value is in the range of from 1/3 to 1/10.

31. Apparatus according to claim 2 wherein said magnification has an absolute value substantially equal to one of 1/4 and 1/5.

32. Apparatus according to claim 17 wherein said projection beam comprises extreme ultraviolet radiation having a wavelength in the range of from 8 to 20 nm.

33. Apparatus according to claim 32 wherein said projection beam comprises extreme ultraviolet radiation having a wavelength in the range of from 9 to 16 nm.

34. An apparatus according to any claim 17, wherein the support structure comprises a mask table for holding a mask.

35. An apparatus according to claim 17, wherein the radiation system comprises a radiation source.

36. A device manufacturing method comprising:
projecting a patterned beam of radiation onto a target portion of a layer of radiation-sensitive material on a substrate using an imaging system including precisely four imaging mirrors in the optical path of the projection beam and has an incidence angle classification, C, of 2(−), 6(−), or 9(−), where:

$$C = \sum_{i=1}^{4} a_i \cdot 2^{(4-i)} \left( \frac{M}{|M|} \right)$$

$a_i$=1 if an angle of incidence of a chief ray at mirror i is negative,
$a_i$=0 if the angle of incidence of the chief ray at mirror i is positive, M is a magnification of the projection system, and the index i numbers the mirrors from object to image.

37. A device manufactured in accordance with the method of claim 36.

38. A device manufacturing method comprising:

projecting the patterned beam onto a target portion of the substrate, wherein said projection system has precisely eight imaging mirrors in the optical path of the projection beam and has an incidence angle classification, C, of C, of 2(+), 5(+), 9(+), 12(+), 13(+), 18(+), 18(−), 19(+), 20(+), 21(+), 22(+), 23(+), 25(+), 26(+), 34(−), 36(+), 37(+), 38(−), 45(+), 46(+), 49(+), 52(+), 53(+), 54(+), 54(−), 55(−), 59(−), 68(+), 69(+), 73(+), 74(+), 77(+), 82(+), 82(−), 85(+), 88(+), 89(+), 90(−), 92(+), 93(+), 97(+), 100(−), 101(+), 102(−), 104(+), 105(+), 106(+), 106(−), 107(+), 108(+), 109(+), 109(−), 110(+), 110(−), 111(+), 113(+), 116(+), 117(+), 118(+), 118(−), 120(+), 121(+), 122(−), 123(−), 132(+), 133(+), 134(−), 137(+), 138(+), 141(+), 145(+), 145(−), 146(+), 146(−), 147(+), 148(+), 148(−), 149(+), 150(+), 150(−), 151(+), 151(−), 152(−), 153(+), 154(+), 154(−), 155(+), 155(−), 156(+), 157(+), 159(+), 161(+), 162(−), 163(−), 164(+), 165(+), 166(+), 166(−), 167(+), 168(+), 169(+), 170(+), 170(−), 171(+), 172(+), 173(+), 174(+), 175(+), 176(+), 177(+), 178(−), 179(+), 180(+), 180(−), 181(+), 181(−), 182(+), 182(−), 183(+), 183(−), 184(+), 185(+), 185(−), 186(−), 187(+), 187(−), 188(−), 189(+), 196(+), 197(+), 201(+), 203(+), 205(+), 209(+), 214(−), 216(+), 217(+), 218(+), 218(−), 225(+), 228(+), 229(+), 230(+), 232(+), 233(+), 235(+), 236(+), 237(+), 238(−), 243(+), 246(+), 247(+), 248(+), 250(−), where:

$$C = \sum_{i=1}^{8} a_i \cdot 2^{(8-i)} \left(\frac{M}{|M|}\right)$$

$a_i=1$ if an angle of incidence of a chief ray at mirror i is negative, $a_i=0$ if the angle of incidence of the chief ray at mirror i is positive, M is a magnification of the projection system, and the index i numbers the mirrors from object to image.

\* \* \* \* \*